United States Patent [19]
Adams et al.

[11] Patent Number: 5,914,553
[45] Date of Patent: Jun. 22, 1999

[54] MULTISTABLE TUNABLE MICROMECHANICAL RESONATORS

[75] Inventors: Scott G. Adams, Ithaca, N.Y.; Yongmei Cindy Wang, Sunnyvale, Calif.; Noel C. Macdonald; James S. Thorp, both of Ithaca, N.Y.

[73] Assignee: Cornell Research Foundation, Inc., Ithaca, N.Y.

[21] Appl. No.: 08/915,648

[22] Filed: Aug. 21, 1997

Related U.S. Application Data

[63] Continuation of application No. 08/876,380, Jun. 16, 1997.

[51] Int. Cl.$^6$ .................................................. H02N 1/00
[52] U.S. Cl. .......................................................... 310/309
[58] Field of Search .............................. 310/309; 333/186, 333/191, 197; 361/283.1, 287, 278

[56] References Cited

U.S. PATENT DOCUMENTS

| | | | |
|---|---|---|---|
| 3,498,138 | 3/1970 | Stewart | 438/32 |
| 3,672,985 | 6/1972 | Nathanson et al. | 73/497 |
| 3,826,228 | 9/1974 | Martin | 184/11.2 |
| 4,381,672 | 5/1983 | O'Connor et al. | 73/509.15 |
| 4,437,226 | 3/1984 | Soclof | 438/337 |
| 4,472,239 | 9/1984 | Johnson et al. | 438/49 |
| 4,483,194 | 11/1984 | Rudolf | 73/514.18 |
| 4,522,682 | 6/1985 | Soclof | 438/337 |
| 4,552,436 | 11/1985 | Hanssen | 349/103 |
| 4,653,326 | 3/1987 | Danel | 73/514.21 |
| 4,670,092 | 6/1987 | Motamedi | 438/52 |
| 4,682,503 | 7/1987 | Higashi et al. | 73/755 |
| 4,685,198 | 8/1987 | Kawakita et al. | 438/410 |
| 4,706,374 | 11/1987 | Murakami | 438/52 |
| 4,711,128 | 12/1987 | Boura | 73/514.18 |
| 4,736,629 | 4/1988 | Cole | 73/514.32 |
| 4,740,410 | 4/1988 | Muller et al. | 428/133 |
| 4,746,621 | 5/1988 | Thomas et al. | 438/624 |
| 4,750,363 | 6/1988 | Norling | 73/497 |

(List continued on next page.)

FOREIGN PATENT DOCUMENTS

| | | | |
|---|---|---|---|
| 62-232171 | 12/1987 | Japan | H01L 29/84 |
| 63136982 | 9/1989 | Japan | H02N 1/00 |
| 58-89859 | 2/1994 | Japan | H01L 29/00 |

OTHER PUBLICATIONS

Core et al., "Fabrication Technology for an Integrated Surface–Mechanical Sensor", Solid State Technology, Oct. 1993, pp. 39–47 Oct. 93.

Kubota et al. "New SOI CMOS Process with Selective Oxidation ", IDEM 86, pp. 814–816 1986.

Tang, et al; "Laterally Driven Polysilicon Resonant Microstructures, Sensors and Actuators," 20 (1989) pp. 25–32 no month.

Wilson, et al; "Highly Selective, High Rate Tungsten Deposition, " Materials Research Society, 1985, pp. 35–43–no month.

Zhang et al.; "AN RIE Process for Submicron, Silicon Electromechanical Structures," IEEE, May 24, 1991, pp. 520–523.

Arney et al.; "Formation of Submicron Silicon–on–Insulator Structures by Lateral Oxidation of Substrate Silicon Islands, "J. Vac. Sci. Technol. B 6(1)), Jan/Feb. 1988, pp. 341–345.

(List continued on next page.)

*Primary Examiner*—Thomas M. Dougherty
*Attorney, Agent, or Firm*—Jones, Tullar & Cooper PC

[57] ABSTRACT

A multistable tunable electromicromechanical resonator structure incorporates electrostatic actuators which permit modification of the resonant frequency of the structure. The actuators consist of sets of opposed electrode fingers, each set having a multiplicity of spaced, parallel fingers. One set is mounted on a movable portion of the resonator structure and one set is mounted on an adjacent fixed base or substrate, with the fingers in opposed relationship and their adjacent ends spaced apart by a gap. An adjustable bias voltage across the sets of electrodes adjusts the resonant frequency of the movable structure and shifts the structure to a bistable state. Application of an alternating drive signal drives the structure to chaotic oscillation.

15 Claims, 16 Drawing Sheets

U.S. PATENT DOCUMENTS

| | | | |
|---|---|---|---|
| 4,772,928 | 9/1988 | Dietrich et al. | 257/254 |
| 4,776,924 | 10/1988 | Delapierre | 438/52 |
| 4,783,237 | 11/1988 | Aine et al. | 438/52 |
| 4,783,821 | 11/1988 | Muller et al. | 381/173 |
| 4,845,048 | 7/1989 | Tamaki et al. | 438/410 |
| 4,851,080 | 7/1989 | Howe et al. | 438/53 |
| 4,853,348 | 8/1989 | Tsubouchi et al. | 438/246 |
| 4,867,842 | 9/1989 | Bohrer et al. | 438/53 |
| 4,945,765 | 8/1990 | Roszhart | 73/514.29 |
| 4,980,317 | 12/1990 | Loblinger et al. | 438/717 |
| 4,981,552 | 1/1991 | Mikkor | 438/52 |
| 5,025,346 | 6/1991 | Tang et al. | 361/283.1 |
| 5,045,152 | 9/1991 | Sickafus | 438/53 |
| 5,068,203 | 11/1991 | Logsdon et al. | 438/53 |
| 5,072,288 | 12/1991 | MacDonald et al. | 257/420 |
| 5,095,752 | 3/1992 | Suzuki et al. | 73/514.32 |
| 5,121,180 | 6/1992 | Berlnghause | 257/417 |
| 5,126,812 | 6/1992 | Greiff | 257/417 |
| 5,149,673 | 9/1992 | MacDonald et al. | 438/611 |
| 5,175,521 | 12/1992 | Larson | 333/235 |
| 5,179,499 | 1/1993 | MacDonald et al. | 361/313 |
| 5,198,390 | 3/1993 | MacDonald et al | 438/52 |
| 5,205,171 | 4/1993 | O'Brien et al. | 73/514.18 |
| 5,228,341 | 7/1993 | Tsuchitani | 73/514.36 |
| 5,235,187 | 8/1993 | Arney et al. | 250/306 |
| 5,249,465 | 10/1993 | Bennett | 73/510 |
| 5,314,572 | 5/1994 | Core | 216/17 |
| 5,345,824 | 9/1994 | Sherman | 73/514.18 |
| 5,353,641 | 10/1994 | Tang | 73/514.18 |
| 5,357,803 | 10/1994 | Lane | 73/514.18 |
| 5,375,033 | 12/1994 | MacDonald | 361/281 |
| 5,399,415 | 3/1995 | Chen | 428/209 |
| 5,449,903 | 9/1995 | Arney et al. | 250/306 |
| 5,455,547 | 10/1995 | Lin et al. | 333/186 |
| 5,491,604 | 2/1996 | Nguyen et al. | 361/278 |
| 5,537,083 | 7/1996 | Lin et al. | 333/186 |
| 5,780,948 | 7/1998 | Lee et al. | 310/81 |

OTHER PUBLICATIONS

Lutze, et al.; "Anisotropic Reactive Ion Etching of Aluminum Using $Cl_2$, $BCl_3$, and $CH_4$ Gases", J. Electrochem. Soc.vol.137, No. 1, Jan. 1990 pp. 249–252.

Mele et al; "Anistotropic Reactive Ion Etching of $MoSi_2$ and In Situ Doped n+ and p+ Polysilicon Using $Cl_2$ and $BCL_3$ " J. Electrochem. Soc.: Solid–State Science Technology, Sept. 1988 pp. 2373–2378.

Yao et al; "Fabrication of High Frequency Two–Dimensional Nanoactuators for Scanned Probe Devices; " Journal of Microelectromechanical Systems; vol. 1; No. 1; Mar. 1992; pp. 14–22.

Yao et al. "Nanostructures in Motion, " Nanostructures and Mesoscopic Systems; Wiley P. Kirk and Mark Reed; Eds. Academic Press; De. 1991; pp. 1–9.

Zhang, et al.; "A RIE Process for Submicron, Silicon Electromechanicl Structures, " IOP Publishing Ltd., 1992 pp. 31–38 no month.

Payne, et al; "Surface Micromachined Accelerometer: A Technology Update, " SAE International Congress and Exposition. Feb. 25–Mar. 1, 191 pp. 127–135.

Goodenough, "Airbags Boom When IC Accelerometer Sees 50 G, " Electronic Design, Aug. 8, 1991, pp. 45–56.

Woodson et al.; "Electromechanical Dynamics Part III; Elastic and Fluid Media," Introduction to the Electromechanics of Elastic Media, 1985 pp. 704–707 no month.

Lin et al; "Micro Electromechanical Filters for Signal Processing, "Micro Electro Mechanical Systems '92, Travemunde (Germany), Feb. 4–7 1992, pp. 226–231.

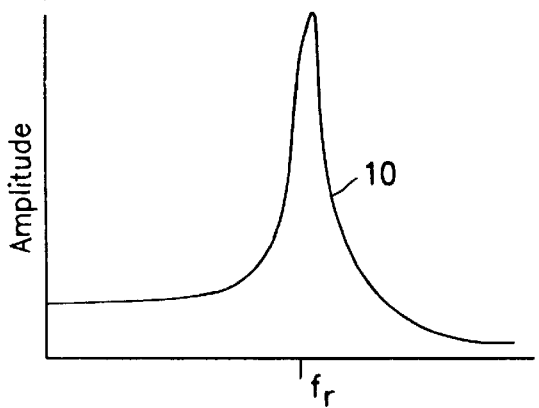
FIG. 1
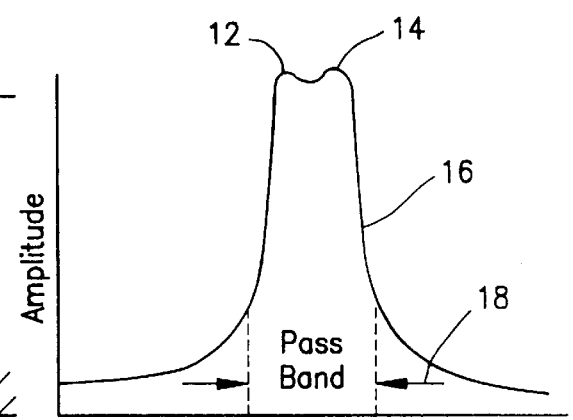
FIG. 2
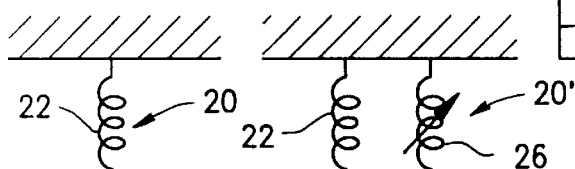
FIG. 3    FIG. 4
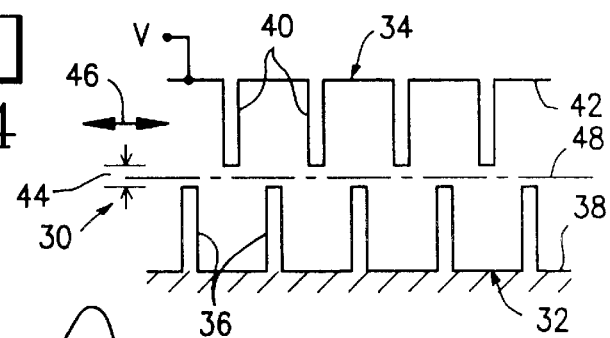
FIG. 6
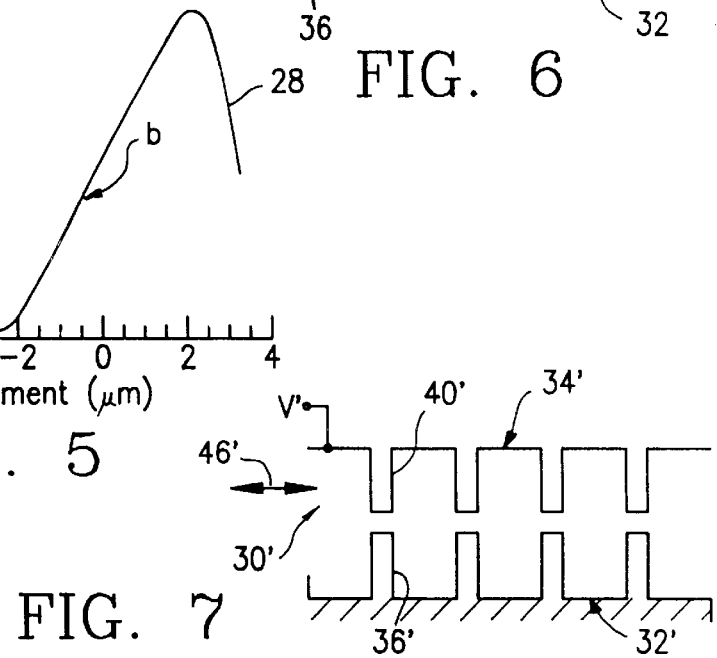
FIG. 5
FIG. 7

FIG. 29a
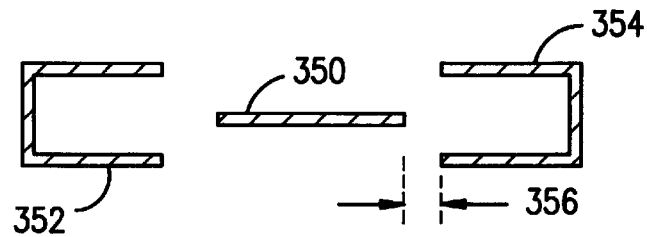
FIG. 29b
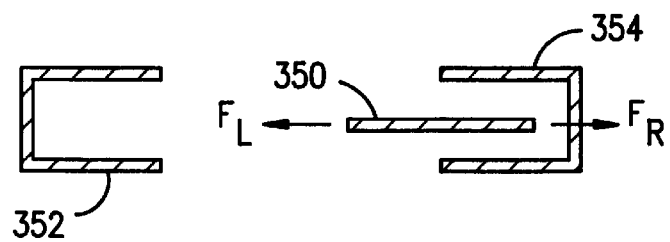
FIG. 29c
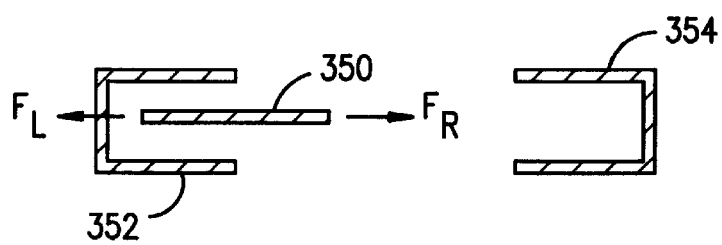
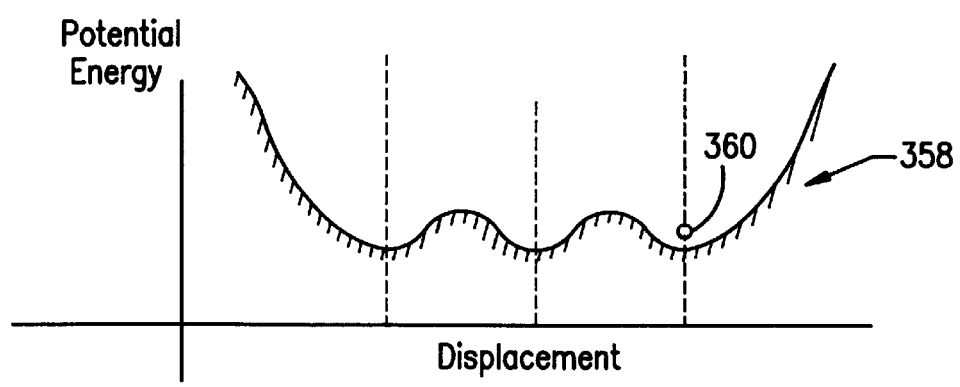
FIG. 29d

Analog phase-locked loop

MULTISTABLE TUNABLE MICROMECHANICAL RESONATORS

BACKGROUND OF THE INVENTION

This application is a continuation of copending application Ser. No. 08/876,380, filed Jun. 16, 1997 and entitled *"Multistable Tunable Micromechanical Resonators"*.

This invention was made with Government support under Contract No. DABT 63-92-C-0019 awarded by ARPA. The Government has certain rights in the invention.

The present invention relates, in general, to mechanical oscillators and resonators, and more particularly to tunable micromechanical devices wherein the resonant frequency of oscillators and resonators can be selectively increased and decreased, wherein stable conditions can be established, and wherein chaotic motion can be provided.

In the field of electromechanical filters, high Q mechanical resonators are used to pass frequencies very close to the resonant frequency of the mechanical structure. Pass band filters can be constructed using resonators in parallel, where the resonant frequencies of two or more resonators are close together. However, even apparently identical micromechanical devices such as oscillators or resonators have variations in their resonant frequencies, even when they are fabricated on the same die, because of differences in materials dimensions, and the like from one device to the next, and due to drift over a period of time. This inhibits the reproduceability and the quality of such devices, and results in the need for a method or structure for tuning their resonant frequencies quickly, easily, and reliably.

Pass band filters have been constructed which utilize a series of resonators in parallel, but techniques for adjusting their resonant frequencies require the use of processes such as laser trimming and selective deposition (see "Microelectromechanical Filters for Signal Processing," Liwei Lin et al, proceedings IEEE Microelectromechanical Systems (Travemunde, Germany) February 1992, pages 226–231. See also *Electromechanical Dynamics part III: Elastic and Fluid Media*, Herbert H. Woodson et al, Robert E. Kreger Publishing Co., 1985, pages 704–707). Such techniques have not been entirely satisfactory. In addition, previous work on the theory of electrostatic tuning actuators and their associated nonlinearities has been done, but such work only addresses resonant frequency reduction, not augmentation.

SUMMARY OF THE INVENTION

The present invention is directed to electrostatic actuators which provide a mechanism for electromechanically increasing or decreasing the stiffness and thus the resonant frequency of mechanical oscillators, resonators, accelerometers, electromechanical filters and the like. The mechanism is easily included in an accelerometer or other device design not only to compensate for variations that can occur in the fabrication process, but also to permit adjustments of device sensitivity or to selectively vary the resonant frequency to achieve a desired frequency response range. More particularly, the present invention utilizes electrostatic actuators for electromechanical filter devices which incorporate selective stiffness augmentation and reduction to allow selective tuning of such devices.

Briefly, the tunable micromechanical resonator of the present invention is directed to devices such as oscillators, accelerometers, filters, or the like which are mounted or supported for relative motion with respect to, for example, a substrate, and which, when driven by an external force, have a resonant frequency. Such devices may herein be referred to as resonators or micromechanical resonators. Such devices, in accordance with the invention, are tuned by means of actuators which electromechanically alter the stiffness of the resonator device and thus alter its resonant frequency.

The resonator of the invention includes a movable released structure which may, in the preferred embodiment, be in the form of an elongated beam fabricated from single crystal silicon. The resonator is fabricated using a single mask process such as that described and illustrated in U.S. patent application Ser. No. 08/312,797, entitled "Microstructures and Single Mask, Single-Crystal Process for Fabrication Thereof," of Kevin A. Shaw, Z. Lisa Zhang and Noel C. MacDonald, filed Sep. 27, 1994, (Docket CRF D-1307C) the disclosure of which is incorporated herein by reference. That application describes a single-mask, low temperature, self-aligned process for the fabrication of microelectromechanical structures (MEMS), which may be referred to as the SCREAM-I process (single crystal reactive etch and metal). It is a dry bulk micromachining process which uses reactive ion etching to both define and release structures of arbitrary shape and to provide defined metal surfaces on the released structure as well as on stationary interconnects, pads and the like. Structures having widths in the range of 0.5 micrometers to 5 micrometers, with structural depth (or height) of between about 10 and 20 micrometers can be fabricated using this process, with all the structural elements, including movable elements such as beams and stationary elements such as interconnects, beams and contact pads defined with a single mask so that metal contacts can be applied to the structure in a self-aligned manner.

In the SCREAM-I process, deep isolating trenches are formed completely around defined structures. Thereafter, the structures are undercut to selectively release them and to produce cavities at the bases of surrounding mesas. Thereafter exposed surfaces are metalized. The undercutting and the formation of cavities at the bases of surrounding mesas serve to break the continuity of the deposited metal, thereby electrically isolating the metal on released structures and on defined mesas from the metal on the bottom of the trenches. A dielectric layer isolates the metal from the underlying substrate. The elements defined by the trenches are interconnected by the metal layer so that released structures can be electrically connected through the metal layer to pads in the surrounding mesas. Interconnects are provided in selected locations, with the interconnects and pads also being defined by the trenches. Thus, with only a single mask, defined high-aspect-ratio, free-standing or released single-crystal silicon structures coated with silicon dioxide and aluminum are produced. The outer coating of aluminum forms electrodes which are used in the present invention as electrostatic actuators, as will be described.

In its simplest form, the resonator of the present invention consists of a mechanically movable component which is suspended for motion with respect to a substrate. This component, which may be a released MEM elongated beam fabricated from the substrate, for example, is suspended by suitable flexible supports such as laterally extending flexible arms which mount the movable component to the adjacent substrate and constrain it to motion along a selected path, such as the axis of the component. These flexible support arms act as springs, while the movable component acts as a mass which may be used to sense acceleration, may be used as a mechanical resonator, or oscillator, or for like purposes. The motion of this component may be at a resonant frequency which is dependent upon the mass of the component and the flexibility or stiffness of the spring-type arms.

Tuning of the resonance of the mechanical structure is, in accordance with the present invention, provided by one or more electrostatic actuators which consist of pairs of comb-like fingers, each pair consisting of two sets of opposed fingers. One set of a pair is mounted on the mechanically movable component of the resonator for motion with respect to the opposite set, which is mounted so as to be stationary, and thus may be mounted on an adjacent mesa. In one embodiment, the sets of fingers in a pair do not overlap or interleave, but are in an end-to-end spaced relationship to form a gap along a path generally parallel to the path of motion of the movable component. Thus, the fingers are mounted to move past each other in end-to-end relationship without contact. A voltage applied across the opposed sets of fingers produces electrostatic force fields in the gap between the ends of the opposed fingers, these forces being in the form of fringing fields at the ends of the opposed fingers. The fringing fields produce actuation forces on the opposed sets of fingers to either increase or reduce the axial stiffness of the component. These pairs of comb-like fingers may be referred to as actuator comb drives which incorporate finger electrodes capable of being activated by applied voltages. Pairs of comb drives may be positioned at various locations on the mechanically movable component, with the drives being connected electrically to suitable circuitry, preferably on the substrate, for independent, controlled energization. The actuator comb drives control the stiffness of the component to augment or to reduce its resonant frequency. The actuator may also be energized to drive the structure into motion, depending upon the voltages applied and their frequency.

Comparable results are achievable with a variety of actuator geometries. For example, in another embodiment, instead of the above-described parallel structure where the resonator component moves in a path parallel to the actuator gap, comb drives can be mounted for motion of the opposed sets of electrodes perpendicular to the gap; i.e., toward and away from each other, with an applied voltage across the two sets controlling the force versus deflection characteristics. Even a single pair of parallel plate electrodes exhibits force versus deflection responses that can be used to tune the resonant frequency of an oscillating device. However, the fringing field actuator described above contains a significant number of advantages over others, and is preferred.

The resonant structure with its adjacent actuators can be utilized in a wide variety of applications. Thus, for example, a bistable MEMS device can be produced through the use of two sets of electrostatic actuators. The actuators act on a spring-mass system and can be excited to cause an original stable equilibrium position of the spring mass to be made unstable, with two new stable equilibrium points being formed at opposite ends of the path of motion of the spring mass system. The device can be excited to produce period doubling on tripling, long period oscillations or chaotic motion in either of its two new equilibrium points.

When opposing sets of comb actuators are used with a spring mass system, the device is monostable at low voltages. As the applied voltage is increased, the resonant frequency decreases; a further increase in the voltage eventually leads to a bifucation process where the original equilibrium point becomes unstable, and two new stable points form. In terms of potential energy, the system can be described as having two wells. At this point, if the voltage on the actuator on one side of the spring mass is decreased, the spring mass will be moved to the stable position adjacent the actuator on the opposite side.

Once the device is in a bistable state, the device can be excited by AC drive voltages at various frequencies and amplitudes to obtain various dynamic behavior patterns in the spring mass. Thus, by increasing the amplitude of the excitation drive signal, a period tripling can be produced, and this can occur in either state. A chaotic response can also be produced, with oscillations over a broad band of frequencies. Such a chaotic response can be utilized for encryption and description using a coupled pair of the MEM devices.

BRIEF DESCRIPTION OF THE DRAWINGS

The foregoing, and additional objects, features and advantages of the present invention will be more clearly understood from the following detailed description of preferred embodiments of the present invention, taken in conjunction with the accompanying drawings, in which:

FIG. 1 is a curve illustrating the frequency vs. amplitude characteristics of a simple resonant system;

FIG. 2 is a curve which illustrates the frequency vs. amplitude characteristics of a band pass filter using parallel resonators;

FIG. 3 is a diagram of a simple spring mass resonant system;

FIG. 4 is a diagram of a spring mass system modified by a tuning actuator;

FIG. 5 is a curve which illustrates the force vs. displacement characteristics of a tuning actuator in accordance with the invention;

FIG. 6 is a diagrammatic illustration of a comb-type actuator used for stiffness reduction in an electromicromechanical resonator;

FIG. 7 is a diagrammatic illustration of a comb-type actuator used for stiffness augmentation in an electromicromechanical resonator;

FIGS. 29a, 29b, 29c and 29d are diagrammatic models of a tristable actuator;

DESCRIPTION OF PREFERRED EMBODIMENTS

Figure 8:
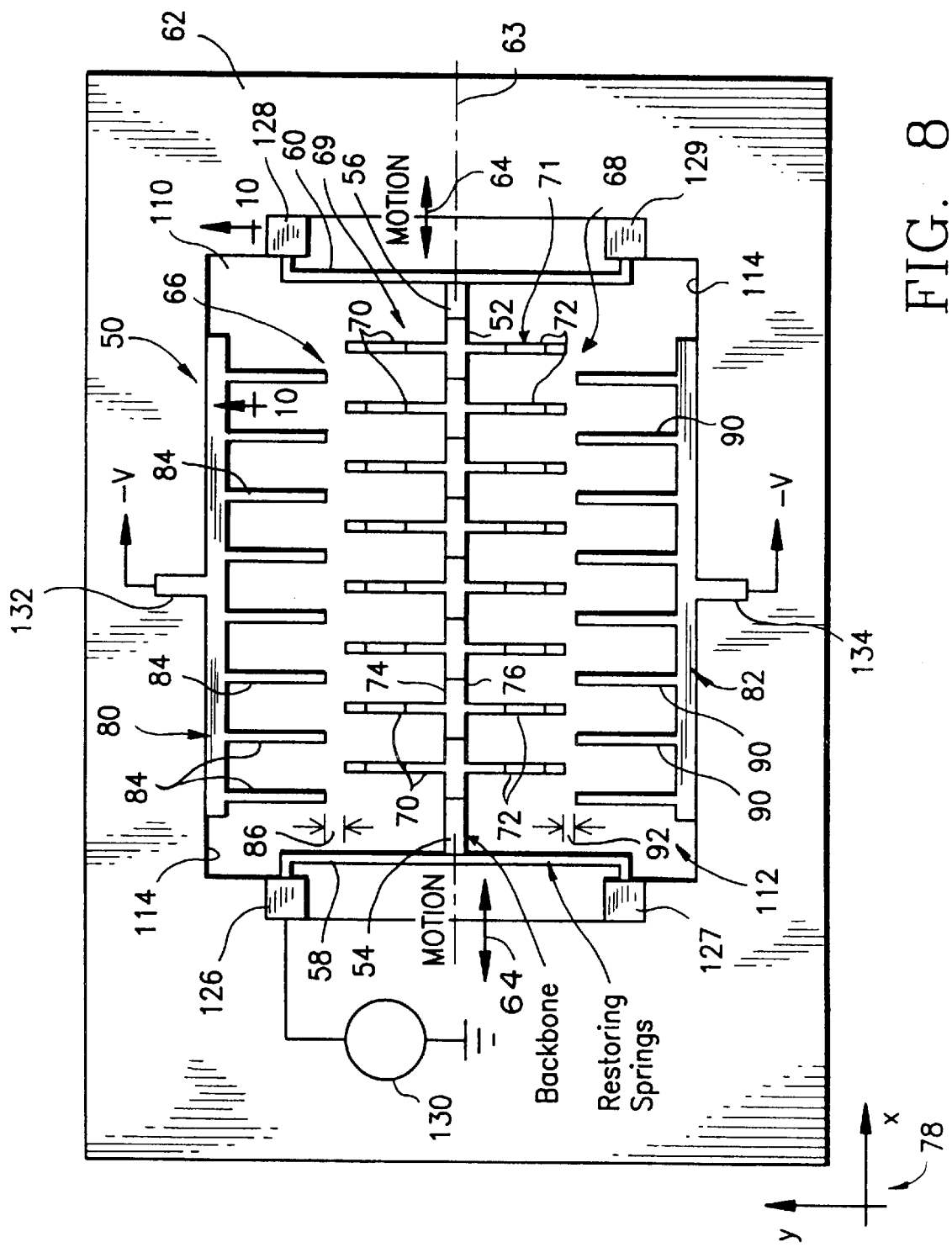
FIG. 8 is a diagrammatic top plan view of a tunable electromicromechanical resonator in accordance with the invention, utilizing two parallel electrostatic tuning actuators.

As illustrated in FIG. 1, a high Q mechanical resonator produces a frequency versus amplitude curve such as that illustrated at 10, with a peak amplitude occurring at a resonant frequency $f_r$. If two or more resonators are constructed in parallel with their resonant frequencies close together, as illustrated by the peaks 12 and 14 of curve 16 in FIG. 2, the resulting structure has a pass band such as that illustrated at 18. Because the particular resonant frequency or the pass band of a mechanical structure being used as a filter, for example, is extremely important, the ability to tune such devices becomes essential in micromechanical structures where processing variations will significantly impede reproduceability and thus the quality of such devices.

As is well known, a resonant structure can be modeled by a simple spring mass system, such as the system 20 illustrated in FIG. 3, wherein the natural vibration frequency $F_n$ is determined by the formula $$F_n = \frac{1}{2\pi}\sqrt{\frac{K_{system}}{mass}} \quad \text{(Eq. 1)}$$

where $K_{system}$ is the stiffness of the entire system, which in this case is the mechanical spring 22 having a stiffness $K_{mechanical}$. The system stiffness can be adjusted to alter its natural frequency; in accordance with the present invention, the stiffness of a mechanical system is altered electrically, in the manner illustrated diagrammatically in FIG. 4. Thus, the system 20' includes not only spring 22, but a variable actuator 26 having a stiffness which may be identified as $K_{electrical}$ so that the system 20' has a stiffness which may be identified as:

$$K_{system} = K_{mechanical} + K_{electrical} \quad \text{(Eq. 2)}$$

In order to construct a system that will perform in a manner illustrated in FIG. 4, an electrostatic actuator having a linear force versus deflection response such as that illustrated by curve 28 in FIG. 5 is provided. The tuning actuator has large regions where the forces are predominately linear with respect to deflection, as indicated in regions "a" and "b." The linear region indicated at "a" may be, for example, representative of linear hardening, or stiffening, while the region "b" represents linear softening, or a reduction of stiffness. This linearity means that the force produced by the electrostatic actuator can be viewed as an electrical spring wherein the magnitude of the spring constant can be altered by varying the voltage applied to it.

The basic structure of the electrostatic tuning actuator of the present invention is illustrated in FIGS. 6 and 7, the structure of FIG. 6 illustrating an actuator which will reduce stiffness, and the structure of FIG. 7 illustrating a structure which will augment the stiffness of the system. The device of FIG. 6 illustrates a pair of comb-type electrodes generally indicated at 30 and including a stationary set of electrodes 32 and a movable set of electrodes 34. The stationary set of electrodes 32 includes a plurality of spaced, parallel fingers 36 mounted, secured to, on or formed integrally with a stationary base or substrate 38, while the movable set of electrodes 34 includes a plurality of spaced, parallel fingers 40 mounted on, secured to, or formed integrally with a relatively movable structure 42. The fingers 36 and 40 are opposed; that is, are in a spaced, facing relationship, with their free ends being spaced apart by a gap 44 which is parallel to the direction of motion of structure 42. The gap is sufficiently wide that the stationary set of electrodes 32 will not interfere with the motion of the movable set of electrodes 34. As illustrated by the arrow 46, the direction of motion of the movable set of electrodes 34 is longitudinally along the axis 48 of the structure and perpendicular to the direction in which the fingers 36 and 40 extend.

The structure of the device of FIG. 7 is similar to that of FIG. 6, with similar components being numbered with primed numbers. The difference between the structure of FIG. 6 and that of FIG. 7 is in the nonalignment or alignment of the opposed fingers 36 and 40 or 36' and 40'. Thus, in FIG. 6, the set of electrodes 34 is located so that its fingers 40 alternate with the fingers 36 of set 32 when the actuator 30 is at rest. On the other hand, in the structure 30' of FIG. 7, the fingers 40' are aligned with the fingers 36' in the rest position.

Upon application of a selected voltage across the electrodes 36 and 40 in the device of FIG. 6, fringing electrostatic fields are produced around the free ends of the electrodes 36 and 40, with the fields extending across the gap 44 between the ends of the opposed electrodes. When in the rest, or neutral, position illustrated in FIG. 6, the movable electrode set 34 experiences no net force upon the application of a voltage V and remains in the offset, or alternating position shown. If a mechanical force applied in the direction of arrow 46 deflects the electrode set 34 to the left or to the right out of its rest position, a net force of attraction will be produced by the electrostatic field between electrodes 40 and their respective opposed electrodes 36, which will tend to pull the movable structure 34 further to the left (or further to the right) and thus will continue or aid the motion introduced by the mechanical force. If the mechanical motion of electrode set 34 is considered to be the equivalent of a spring-mass force, the electrostatic force applied by the voltage V may be considered to be the equivalent of a negative spring force which is applied to the system to reduce the overall system stiffness.

In the device of FIG. 7, on the other hand, the application of a voltage V' between the opposed electrodes when the device produces an electrostatic fringing field between opposed electrodes, as described above with respect to FIG. 6, but once again no net force is applied to the balanced arrangement illustrated. However, if the electrode structure 34' is moved to the left or to the right as illustrated by arrow 46', the electrostatic fringing field tends to pull the movable electrode back to its original aligned position. This behavior is equivalent to a positive spring which would tend to stiffen the structure. The force applied by the electrostatic field is linear over a small range of displacement, for example about 1 micrometer, which is more than adequate for micromechanical applications.

Figure 9:
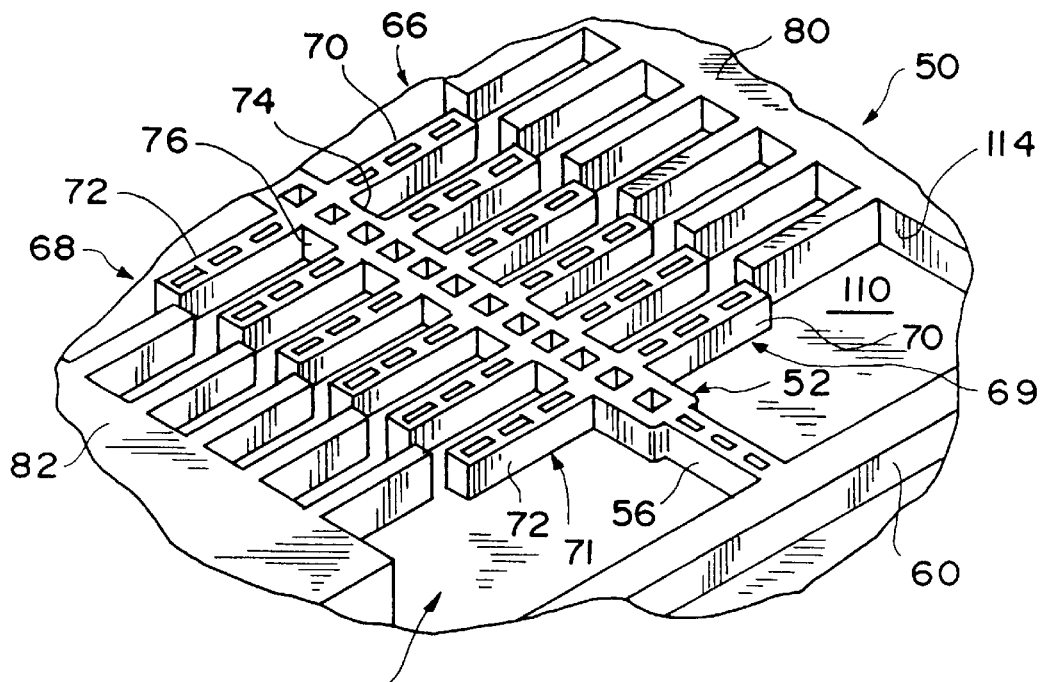
FIG. 9 is an enlarged partial perspective view of the resonator of FIG. 8.

The principles described with respect to FIGS. 6 and 7 are further illustrated in a resonator device 50 shown in top plan view in FIG. 8 and in a partial perspective view in FIG. 9. As there illustrated, the resonator consists of an elongated, movable beam 52 mounted at its ends 54 and 56 to corresponding support arms 58 and 60. These support arms extend laterally from the respective ends 54 and 56 and are connected at their outermost ends to a fixed base, which may be a substrate 62. The beam 52 is supported for with respect to base 62 motion along its longitudinal axis 63 in the direction of arrows 64, with support arms 58 and 60 being secured to hold the beam 52 in place and to constrain it to desired axial path. The support arms 58 and 60 have a high aspect ratio so they are flexible in the x-y plane in which beam 52 lies, and urge the beam 52 toward a neutral rest position when no external force is applied to the beam, to thereby serve as restoring springs for the device. The beam 52 and spring arm 58 and 60 are a micromechanical structure preferably having micron-scale dimensions. The beam 52 is also fabricated to have a high aspect ratio; i.e., with a height of $10-20\mu$ and a width of about $0.5-3\mu$ to provide substantial rigidity in the vertical direction. As illustrated in FIG. 9, the beam may be fabricated in a box configuration for rigidity, to enable it to withstand axial forces which produce beam motion with respect to the substrate. The movable structure has a natural resonant frequency, which is a function of its mass and of the flexibility of the spring arms, when a driving force is applied.

The resonant frequency of the resonator 50 is tuned, in accordance with the present invention, by a pair of electrostatic actuators 66 and of the comb electrode type described with respect to FIGS. 6 and 7. Each pair of actuators includes a first set of movable electrodes mounted on, and preferably integral with, the movable structure of the resonator, and a second, opposed, set of stationary electrodes mounted on, and preferably integral with, the stationary base, or substrate 62. Thus the beam 52 carries a first set 69 of laterally extending finger electrodes 70 and a second set 71 of laterally extending electrodes 72 on opposite sides of beam 52, with fingers 70 in spaced parallel arrangement along one side 74 of the beam and fingers 72 in spaced, parallel relationship along the other side 76 of beam 52. The fingers are preferably perpendicular to the axis 63 of the beam, are aligned with each other on opposite sides of the beam, and are coplanar in the x-y plane 78 of the resonator. If desired, the finger electrodes may be fabricated in the box configuration illustrated in FIG. 9 for rigidity.

Mounted on substrate 62 are two sets of stationary electrodes 80 and 82, set 80 cooperating with electrode set 70 to form actuator 66, and set 82 cooperating with electrode set 72 to form actuator 68. The electrode set 80 includes a plurality of spaced, parallel electrode fingers 84 which extend toward corresponding fingers 70 on beam 52. Electrodes 84 are parallel to electrodes 70 and are non-overlapping; i.e., they have their free ends spaced from the corresponding free ends of electrodes 70 by a gap 86 which is parallel to axis 63 and which has a width which is sufficient to permit axial motion of the beam 52 without the free ends of the electrodes 70 contacting the opposed free ends of the electrodes 84. The gap is sufficiently small to produce a fringing field between the opposed electrodes upon the application of a bias voltage between electrode set 80 and its corresponding electrode set 69, and between electrode set 82 and its corresponding set 71.

In the embodiment of FIG. 8, the fingers 84 of electrode set 80 are offset from the opposed set 69 of fingers 70 in actuator 69, and are spaced equally from each other in the manner described with respect to FIG. 6. Similarly, the electrodes of set 82 are offset from those of set 71 in actuator 68. It will be apparent, however, that by shifting the location of the fixed electrodes during fabrication, or alternatively by shifting the location of the movable fingers on beam 52, the opposed electrodes can be aligned in the manner illustrated in FIG. 7.

As illustrated, gap 86 extends the length of the opposed electrode sets 69 and 80 and is generally parallel to the axis 63 of beam 52. In similar manner, the set 82 of electrodes includes a plurality of spaced, parallel electrode fingers 90, the free ends of which are spaced from the free ends of corresponding electrodes 72 in the electrode set 71, these electrodes being spaced apart by a gap having a width 92 and this being nonoverlapping. The sets 71 and 82 of electrodes 72 and 90 are similar to the sets 69 and 80 discussed above, with electrodes 90 being offset from electrodes 72 and being aligned with electrodes 84 so that the actuators 66 and 68 are symmetrical with respect to the axis 63.

A bias voltage applied between adjacent electrodes 70 and 84 and between adjacent electrodes 72 and 90 can be used to control the relative motion of the beam 52 with respect to the stationary substrate 62 to thereby tune the resonant frequency of the mechanical system including beam 52 and support arms 58 and 60. A mechanical force may be applied to the beam 52 to initiate oscillatory motion of the beam, which motion can be supplied by a drive actuator, as will be described hereinbelow, and the voltage applied to the actuators 69 and 71 is used to adjust the resonant frequency of the system. The symmetry of the actuators and their finger electrodes insures that no net force in the x-y plane is applied to the beam by the bias voltage when the system is at rest.

The micromechanical device illustrated in FIGS. 8 and 9 preferably is fabricated in accordance with the SCREAM-I process described in the above-mentioned Ser. No. 08/312,797, which produces the released beam structure 52 with its lateral electrodes 70 and 72 integrally formed therewith and movable therewith. The beam structure is supported above the floor 110 of a cavity 112 which is formed in the substrate 62 during the fabrication process by the trenches which define the beam structure 52, the electrodes 70 and 72, the support arms 58 and 60, and the stationary electrodes 84 and 90. The electrodes 84 and 90 preferably are in the form of cantilevered beams extending from a side wall 114 of the cavity 112.

Figure 10:
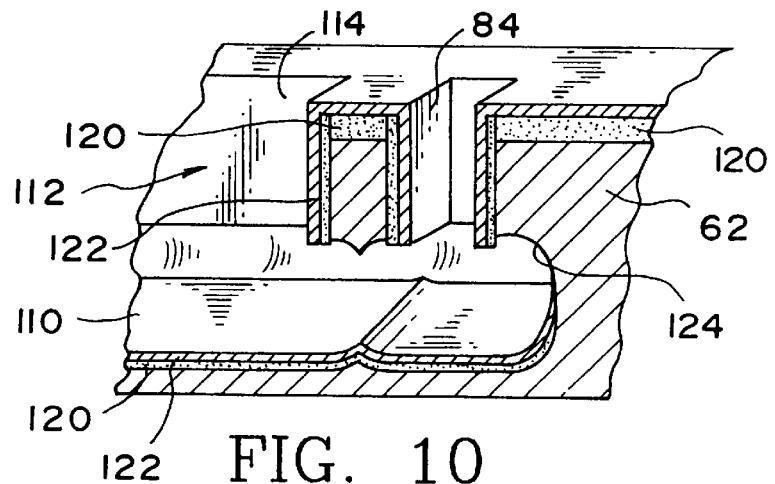
FIG. 10 is a partial cross-sectional view taken along lines 10—10 of the resonator of FIG. 8.

As illustrated in greater detail in FIG. 10, electrode 84 extends in cantilever fashion from sidewall 114 and extends above the floor 110 of cavity 112. The interior of the beam 84 is the same material of the substrate 62, preferably single crystal silicon, with the beam being covered by a dielectric layer 120 and by a metal layer 122 such as aluminum. During the undercutting step used in the SCREAM-I process to release the beams and the electrodes, the side walls are also undercut to produce a concavity 124. The aluminum layer 122 also is provided on the floor 110 of the cavity, with the suspended beam and the undercut region 124 at the edge of the cavity providing electrical isolation between various regions of the metal layer.

The metal layer 122 on the surface of substrate 62 may be patterned to provide electrical contact regions such as those illustrated at 126 through 129 in FIG. 8 for connection of the electrodes 70 and 72 to a voltage source 130. In similar manner, connector pads 132 and 134 may be provided on the surface of substrate 62 for providing electrical connections between the electrode sets 80 and 82, respectively, to electrical ground, or to a negative voltage source (−V), whereby a suitable bias voltage may be applied across actuators 66 and 68.

Figure 11:
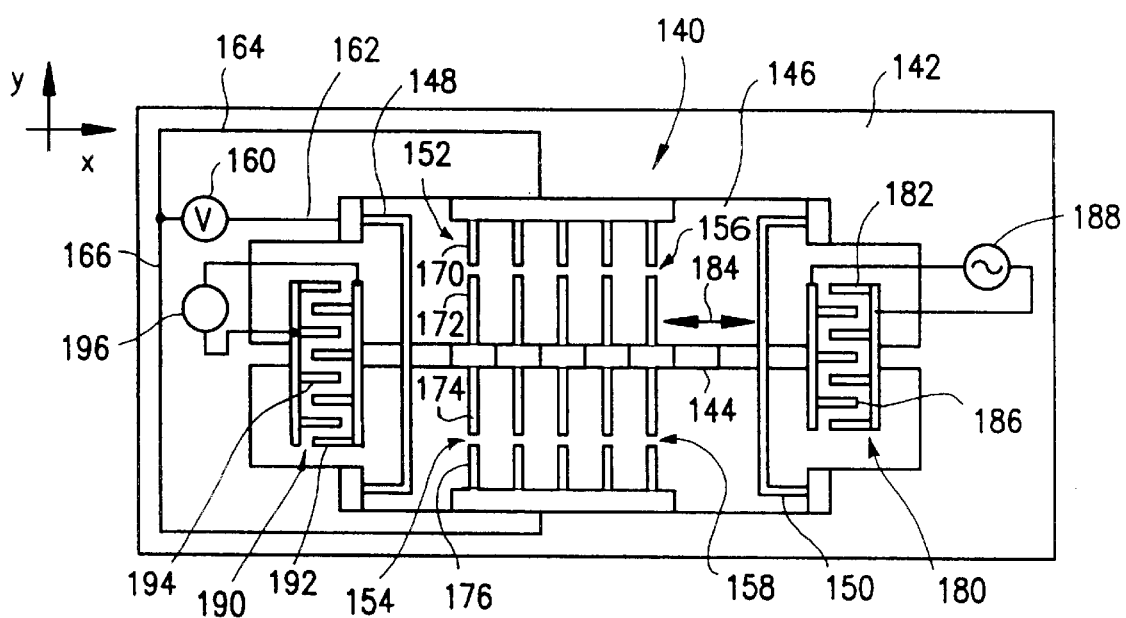
FIG. 11 is a diagrammatic top plan view of the resonator of FIG. 8 incorporating an excitation electrode and a sensing electrode.

A modification of the resonator of FIGS. 8 and 9 is illustrated in FIG. 11, to which reference is now made. In this figure, a resonator 140 is fabricated in a substrate 142 of single crystal silicon, in the manner described with respect to FIG. 8. The resonator includes a movable beam 144 fabricated within a cavity 146 in the substrate, the beam 144 being released from the substrate and mounted for motion with respect to the substrate on support arms 148 and 150 located at opposite ends of the beam. Electrostatic actuators 152 and 154 are provided on opposite sides of beam 144, again as described with respect to FIGS. 8 and 9, with the actuators having respective sets of opposed electrodes spaced apart by gaps 156 and 158. A bias voltage 160 may be applied across actuators 152 and 154 by way of connector 162 electrically connected to the movable beam 144 and connectors 164 and 166 connected to the stationary electrodes of actuators 152 and 154, for example.

The opposed electrodes 170 and 172 of actuator 152 and the opposed electrodes 174 and 176 of actuator 154 are aligned in the manner described above with respect to FIG. 7 in the illustrated embodiment, so that the applied voltage produces an electrostatic field between adjacent opposed electrodes which augments the stiffness of the beam 144, which is the resonant structure for this device. If desired, the electrodes can be offset, as in FIG. 8.

Mechanical motion may be applied to the beam 144, in the illustrated embodiment, by an excitation driver 180 which consists of two sets of opposed, interleaved, comb-type capacitor electrodes. Thus, the excitation driver includes a set of stationary electrodes 182 secured in cantilever fashion to the substrate 142 but extending outwardly from the substrate in a direction parallel to the direction of motion of beam 144, indicated by arrows 184. Opposed movable electrodes 186 are mounted on beam 184 for motion therewith, with the electrodes 182 and 186 being connected across a voltage supply such as that illustrated at 188. Application of an alternating drive voltage across actuator 180 produces longitudinal, or axial motion in the beam 144 at a frequency close to the natural resonant frequency of the beam as determined by the mass of the beam and its electrodes and the stiffness of the support arms 148 and 150. The application of a voltage across the actuators 152 and 154, in the manner described above, will tune the resonance of the beam 144, increasing or decreasing the effective spring constant of the system, in the manner described above.

Motion of the beam 144 may be sensed by means of a sensor capacitor 190 having movable electrodes 192 mounted on beam 144 for motion therewith and having stationary electrodes 194 mounted fixedly on the substrate 142. The actuator 190 consists of two comb-type electrode structures having their respective electrode fingers 192 and 194 interleaved whereby motion of beam 144, and thus of electrodes 192 with respect to electrodes 194, changes the capacitance between the adjacent electrodes. This change in capacitance can be detected by a suitable sensor 196 to provide an output signal which is a measure of the motion of beam 144, with the frequency of the output signal being the resonant frequency of the system as tuned by actuators 152 and 154. The mechanical structure may thus act as a mechanical filter between the input signal 188 and the output 196.

In the foregoing structures, the motion of the movable beam and its electrodes are in a direction perpendicular to the width of the gap between opposed sets of electrodes in each actuator and the actuators are symmetrical along lines parallel to the direction of motion. Accordingly, the tuning actuators do not produce a net force in either the x or y directions when centered, and this parallel relationship is preferred. Nevertheless, favorable results are achievable with other actuator geometries. Thus, for example, as illustrated diagrammatically in FIG. 12, a resonator 200 includes a movable microelectromechanical beam 202 mounted at its opposite ends to laterally extending support arms 204 and 206 which serve as spring arms to confine the motion of the beam in a direction along its axis, as previously described. In this case, however, four tuning actuators are provided as indicated at 208, 210, 212, and 214. All of these actuators are comb-type structures having opposed electrodes, such as the electrode 216 and 218 of actuator 208 which are separated by a gap 220 which extends in a direction perpendicular to the axis of beam 202.

Application of a voltage across the two sets of opposed electrodes 216 and 218 produces an electrostatic field in the region where the fingers come close to overlapping. A force versus deflection plot for this actuation region is illustrated by curve 222 in FIG. 13, where the tuning region is indicated at 224 and the region of typical use is indicated at 226. The matching halves of the actuator of FIG. 12 will collide if the deflection reaches of the amount indicated by dotted line 228. The voltages applied across the sets of electrodes in each of the actuators are used to reduce the stiffness of the resonator structure 200.

Figure 14:
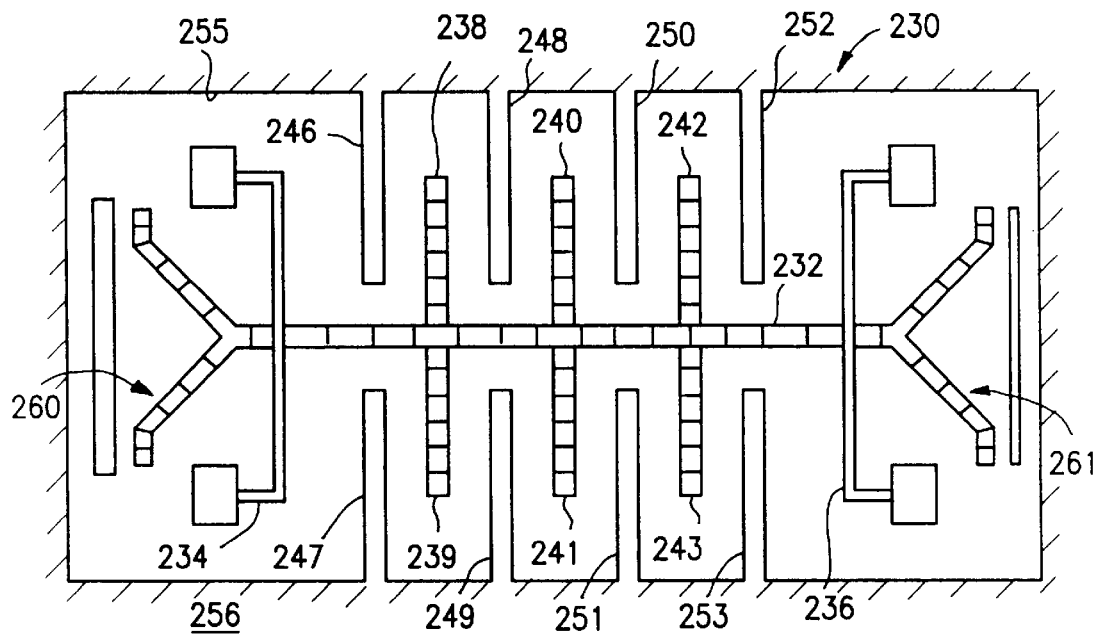
FIG. 14 is a diagrammatic top plan view of a tunable resonator utilizing symmetric parallel plate actuators.

FIG. 14 illustrates another resonator structure 230 wherein movable beam 232 is supported by lateral arms 234 and 236, as described above. Symmetric pairs of parallel plates on each side of the structure are provided in this embodiment to electrostatically reduce stiffness. Thus, laterally extending electrode plates 238 through 243 are mounted on arm 232 for motion therewith. The ends of these electrode plates extend between adjacent fixed electrode plates 246 through 253. The fixed plates are cantilever beams extending from the sidewall 255 of the surrounding substrate 256, as discussed above with respect to FIGS. 8 and 9. By applying a first voltage to the plates 246 through 253 and a second voltage to the plates 238 through 243, the voltages on each side of the movable plates nullify each other and the beam 232 will not experience a net force unless it is displaced from equilibrium. If it is displaced, the force is proportional to the displacement over a small range of displacements on the order of tenths of a micron. These voltages reduce the system's stiffness. If the displacement exceeds a critical value, the electrodes will cause the movable structure to move too far, causing the movable electrodes to strike the stationary electrodes. However, the positive aspect of this structure is that it is very efficient in terms of space.

The structure of FIG. 14 is a highly effective acceleration limit switch, for acceleration in either axial direction will cause the movable structure 232 with its electrodes 238–243 to move toward fixed electrodes 246–253. If the movable and fixed electrodes get too close, the movable electrodes will be drawn toward the fixed electrodes by the applied bias voltage and can then be used to activate a switch such as one of the microswitches 260, 261 illustrated in FIG. 14. The magnitude of the voltage applied across the electrodes determines the magnitude of the acceleration necessary to activate the switch.

It will be understood that the number of electrodes shown in each of the drawings is for purposes of illustration only. It is preferred that large numbers of electrodes be used in each actuator to provide the required sensitivity. Further, dense arrays of actuators can be constructed with a large linear range of operation with the opposed electrodes being fabricated either in or out of alignment to provide stiffness augmentation or reduction, respectively.

The governing equation of motion for a resonator with all the mechanical system components on the left hand side, and all the electrostatic actuator components on the right hand side is as follows:

$$m\ddot{x}+c\dot{x}+kx=F(x,V) \quad \text{(Eq. 3)}$$

The forcing function, $F(x(t),V'(t))$, with time t, displacement x, and voltage V, consists of an excitation force and a passive tuning actuator force, each supplied by a separate actuator:

$$F(x,V_e,V)=F_{excite}(x,V_e)+F_{tuning}(x,V) \quad \text{(Eq. 4)}$$

By proper design of a tuning actuator, it is possible to obtain a passive tuning force, $F_{tuning}$, that is proportional to the displacement, x, where the constant of proportionality is designated as $-k_{elec}$. A simple rearrangement of terms produces at the following equation:

$$m\ddot{x}+c\dot{x}+(k_{mech}+k_{elec})x=F_{excite}(x,V_e) \quad \text{(Eq. 5)}$$

which can be used to determine the effective resonant frequency of the electromechanical system.

$$\omega=\sqrt{\frac{k_{mech}+k^0_{elec}V^2}{m}} \quad \text{(Eq. 6)}$$

where the relation $k_{elec}=K^0_{elec}V^2$, is used to explicitly show the voltage dependence of the actuator's forcing function.

Figure 15:
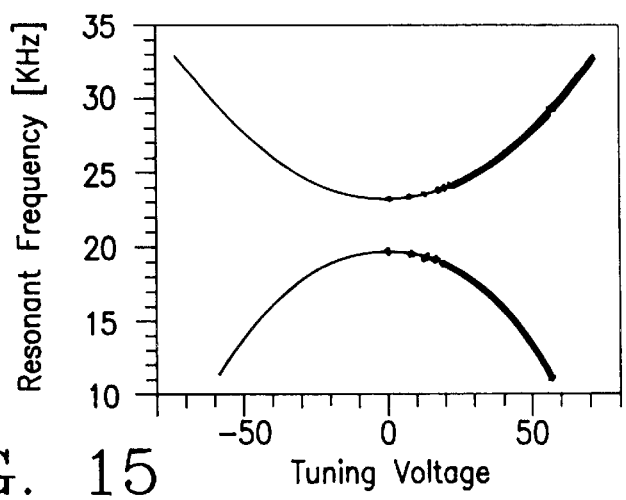
FIG. 15 illustrates the relationship of resonant frequency to changes in tuning voltage for the actuator of FIG. 11, based on experimental data.

Experiments were carried out in a scanning electron microscope to test the operation of a resonator such as that illustrated in FIG. 11. In that device, the bias voltage supplied to the tuning actuator was varied over a range from 0 to 75 volts, and at each step an excitation voltage of approximately 1.5 volts was applied to a driver such as drive 180 in FIG. 11, with the voltage being swept over a suitable range of frequencies. Resonance of the beam; for example, beam 144 of FIG. 11, was determined by selecting the frequency at which the vibration amplitude was a maximum. Care was taken to ensure that the amplitude of vibration was low enough to avoid the frequency versus amplitude hysteresis that is associated with nonlinear stiffness components. FIG. 15 illustrates the results for two tunable oscillators which only differ in their tuning actuator geometries. Mechanically, both oscillators were designed to have identical stiffness and mass. However, in the absence of applied potential, the difference between the resonant frequencies was on the order of 10%. As implied by equation 6, plotting the square of the natural frequency as a function of the voltage squared would ideally yield a straight line.

Figure 16:
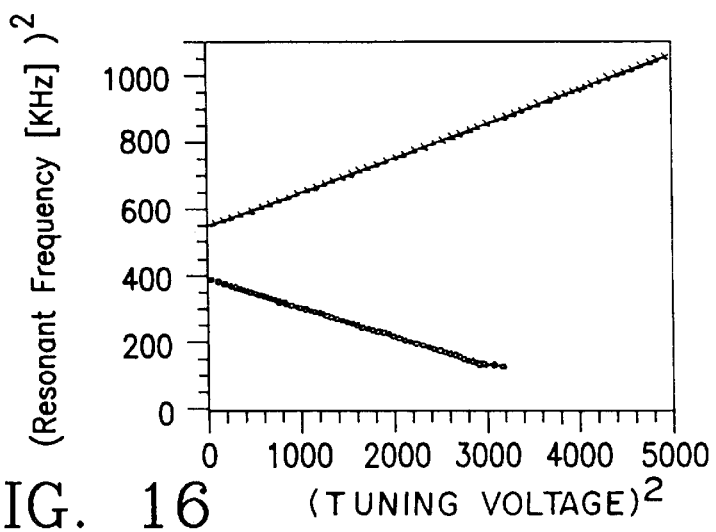
FIG. 16 is a replotting of the data from FIG. 15 to illustrate the linearity of the relationship between resonant frequency squared vs. tuning voltage squared.

FIG. 16, which is a replot of the data shown in FIG. 6, verifies this prediction. Force versus deflection plots for infringing field comb structures were also calculated using a CAD package called "High Aspect Ratio Simulation Package." These plots were calculated for stiffness increasing and stiffness decreasing actuators, and the calculated results are compared to those determined from the experimental data in the following: 1:

TABLE 1

| [N/(mV2)] | Reduction | Augmentation |
|---|---|---|
| Simulation | 9.8 × 10−4 | −9.0 × 10−4 |
| Experiment | 8.3 × 10−4 | −1.20 × 10−3 |
| Comparison | 18% | 10% |

The difference between the simulation and the experimental results is primarily attributed to the sensitivity of the electrostatic actuator to the gap, to the assumptions inherent in the calculations, and to the uncertainty in the total mass of the structure.

For simplicity, the tunable resonator has been considered to be a simple spring mass system where the nonlinearities in a mechanical system and the passive tuning actuators were ignored. However, a careful review of FIG. 5 reveals that the two linear regions "a" and "b" are of different lengths. This means that they have a different cubic term $k_3$ in the equation:

$$F=k_1x+k_3x^3+ \quad \text{(Eq. 7)}$$

By applying a voltage to a stiffness augmentation actuator or a stiffness reduction actuator, the linear term is unaffected, while the cubic term is tuned. In most mechanical systems, a positive cubic restoring force exists, and in many cases this is undesirable. Using the tuning actuator of the present invention, it is possible to reduce the cubic term and even cause it to become negative. More specifically, the stiffness reduction and stiffness increasing actuators will produce negative and positive cubic stiffness contributions, respectively. A theoretical set of stiffness values for the stiffness reduction actuator is shown in Table 2 and their respective places in the governing equation of motion is illustrated in Equation 8:

$$m\ddot{x}+c\dot{x}+(k_{mech}+k^0_{elec}V^2)x+(\pi_{mech}+\eta_{elec}^0V^2)x^3=F_{excite}(x,V_e) \quad \text{(Eq. 8)}$$

TABLE 2

| $\kappa_{mech}$ | 2.6 N/m |
|---|---|
| $\eta_{mech}$ | 9.2 10$^{11}$ N/m$^3$ |

TABLE 2-continued

| | |
|---|---|
| $k_{elec}^0$ | $9.8\ 10^{-4}$ N/(mV |
| $\eta_{elec}^0$ | $1.2\ 10^8$ N/m(m³V²) |
| m | $2.4\ 10^{-10}$ kg |
| c | $200\ s^{-1}$ |

Figure 17:
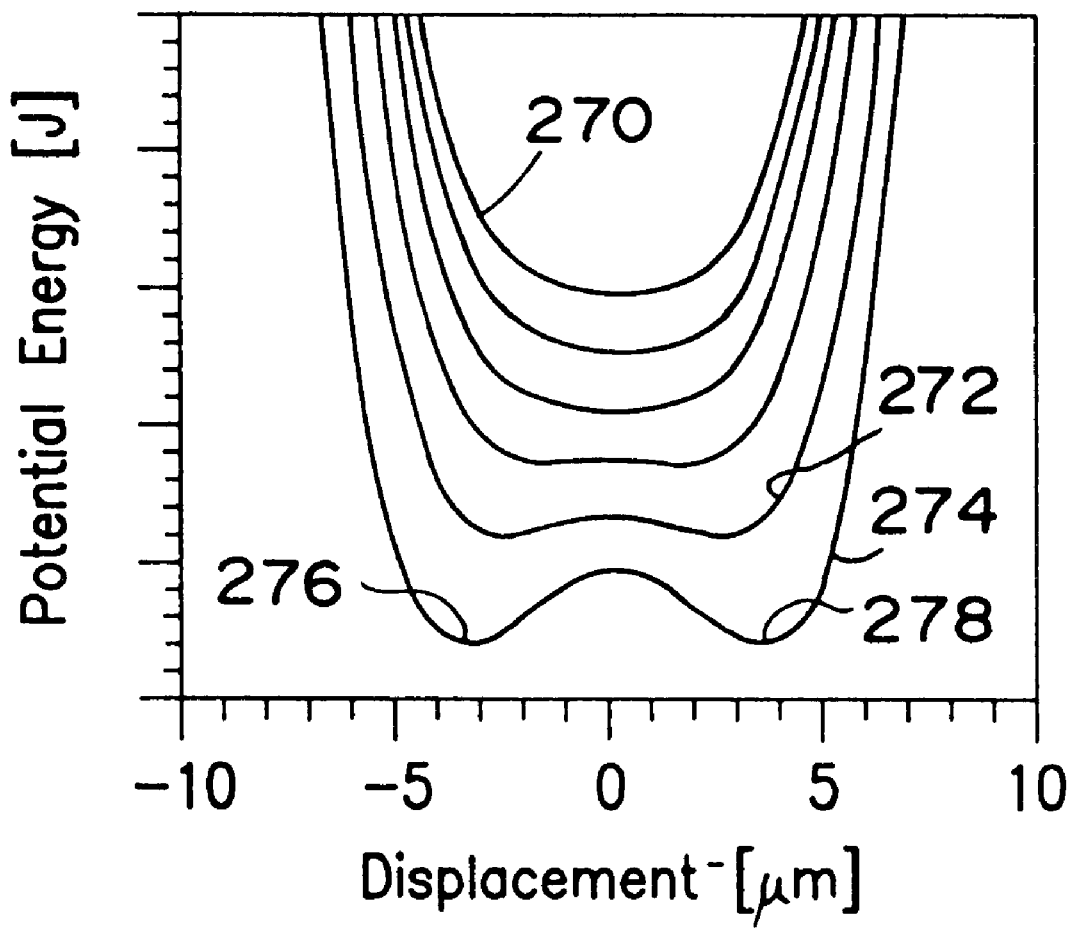
FIG. 17 is a series of curves illustrating system potential energy vs. displacement for different bias voltages.

Potential energy plots of the electromechanical system described hereinabove provide a visual tool in describing the behavior of the system. FIG. 17 is a potential energy diagram of the frequency reduction actuator shown in FIG. 11. Under zero bias voltage across the actuator electrodes, the potential energy plot of curve 270 exhibits a single "well" containing quadratic and quartic terms from the mechanical system. As the bias voltage is increased, the concavity of the well is decreased. This results in the frequency reduction tuning described above. As the bias voltage is increased further, the concavity of the well eventually changes sign, as illustrated by curves 272 and 274, and the single equilibrium point bifurcates into a pair of equilibria 276 and 278. In this range of bias voltages, the system has a double-well potential structure which locally resembles that of a Duffing Oscillator. Thus, by reducing the stiffness of the structure, the net stiffness of the system becomes negative and the original equilibrium point becomes unstable so that the structure will deflect to the left or to the right into one of the two equilibrium points 276 or 278. When a system with a double-well potential is excited by an external force, the system can display a seemingly chaotic or random behavior, as will be described in greater detail below.

From the foregoing, it will be apparent that tuning actuators provide a mechanism for electromechanically altering the stiffness and thus the resonant frequency of a resonator. This technology can easily be included in an accelerometer to compensate for variations that occur in the fabrication process. The sensitivity of the accelerometer is tunable to a particular value, or the resonant frequency can be shifted to achieve a desired frequency response range. In the area of nonlinear oscillators, the resonator behavior is not limited to that of a Duffing Oscillator, for by sinusoidally varying the bias voltage, the oscillator can be provided with a periodic stiffness.

Thus, actuators which tune the resonant frequency of a micromechanical device provide either a positive or a negative spring force which varies in accordance with the square of the applied voltage. In experiments, the resonance frequency has been tuned from 7.7% to 146% of the original, or natural value of the mechanical system, with the limits of the tuning being the electromechanical stability of the device and the dielectric breakdown strengths between the electrode metalization and the substrate. By applying a bias voltage greater than a certain critical bias voltage, a resonator with a stiffness reduction actuator exhibits a double-well potential. This technology can be used to tune the performance of resonant sensors, electromechanical filters, accelerometers, nonlinear oscillators, and the like.

As discussed above with respect to equation 7, the stiffness of a mechanical system can be modeled as:

$$F_{mechanical} = -k_{mech}x - \eta_{mech}x^3 + \quad \text{(higher order terms)}$$

Figure 18:
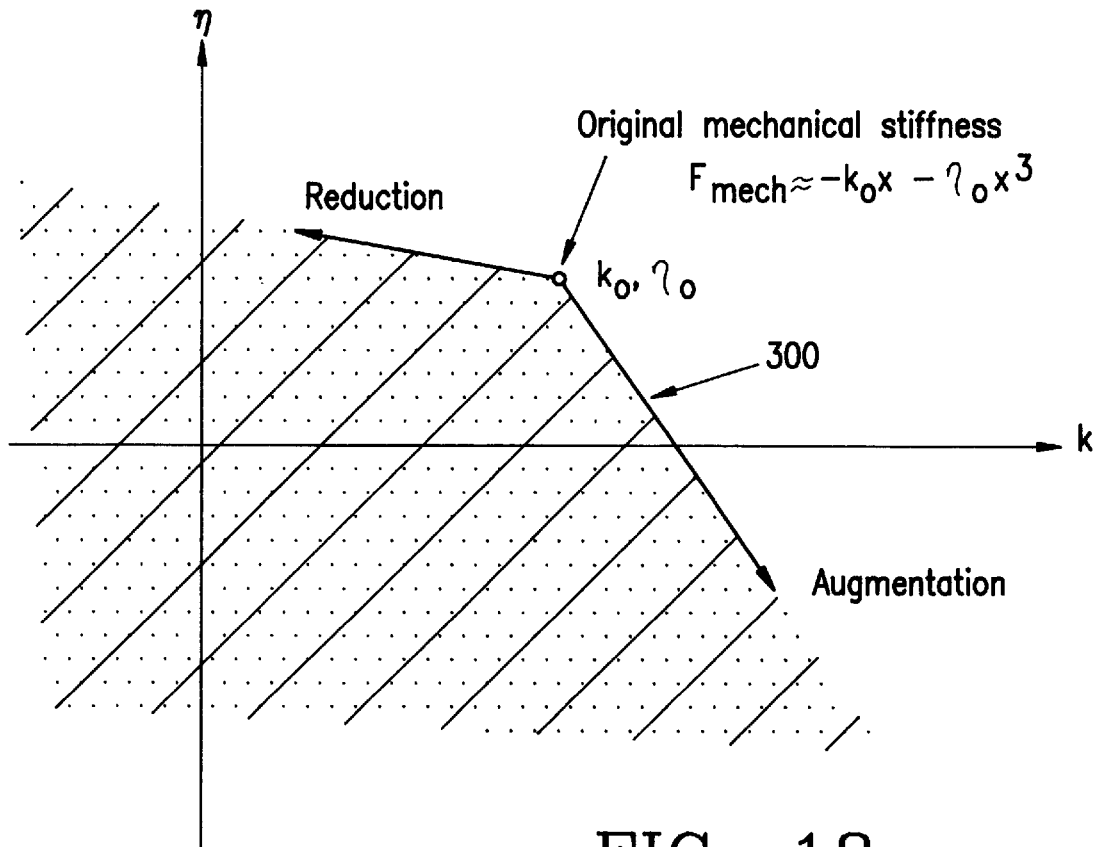
FIG. 18 is an effective stiffness diagram for a mechanical system.

In many cases it would be advantageous to be able to tune the linear stiffness, $k_{mech}$, as well as the nonlinear or cubic stiffness, $\eta_{mech}$, and it has been found that by using a combination of two or more actuators, such as an augmentation actuator and a reduction actuator, it is possible to tune the linear stiffness without affecting the cubic stiffness. Likewise, it is possible to tune the cubic stiffness without affecting the linear stiffness. And more generally, it is possible to tune both the linear and the cubic stiffness to a particular pair of values. This capability is illustrated by graph 300 in an "effective stiffness diagram", FIG. 18. The axes of the figure show the effective linear stiffness, k, on the x-axis and the effective cubic stiffness, $\eta$, on the y-axis. "Effective", means the resulting sum of the mechanical spring and electrical actuator stiffness.

Figure 19:
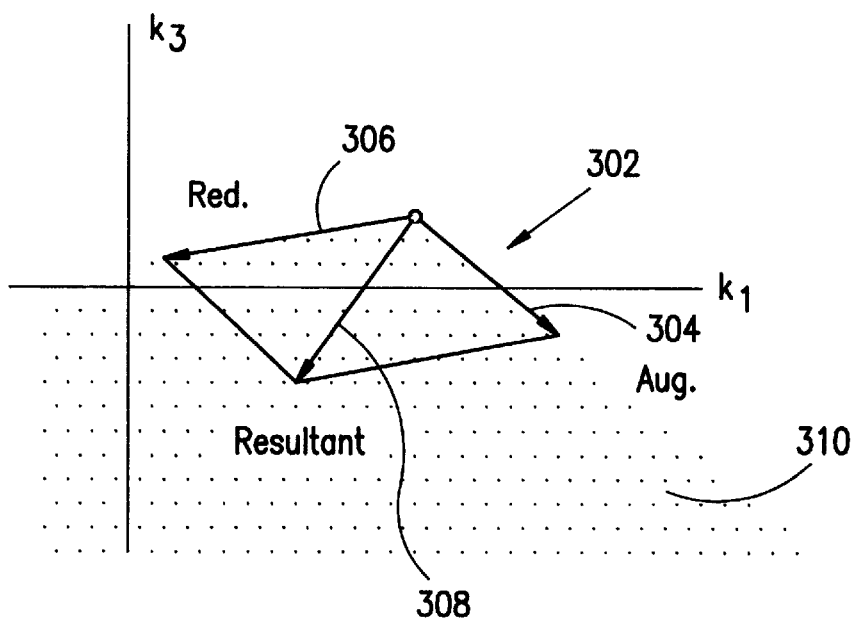
FIG. 19 is a diagrammatic illustration of the vectors of two tuning actuators on a mechanical system.

The effect of a tuning actuator can be represented graphically as a vector. In the case of the augmentation actuator, the expressions $a_1 V_a^2$ and $a_3 V_a^2$ form the components of a vector in a stiffness space. An example of this representation is shown at 302 in FIG. 19. As the voltage, $V_a$, applied to an augmentation actuator is increased, the effective stiffness of the electromechanical system progresses in the direction of the augmentation tuning vector 304, and when applied to a reduction actuator the effective stiffness progresses in the direction of the tuning vector 306.

A device that contains both actuators experiences the sum of the two actuation forces. Therefore, in the stiffness space representation shown in FIG. 19, the resultant tuning vector 308 is the sum of the individual tuning vectors. As indicated by the dotted region 310, two tuning actuators can span a region of the stiffness space. Unlike a linear vector space, however, two tuning vectors cannot span the entire stiffness space. Since the length of the tuning vector is proportional to $V^2$, it is impossible to have a tuning vector point in the opposite direction through a change in voltage.

Figure 20:
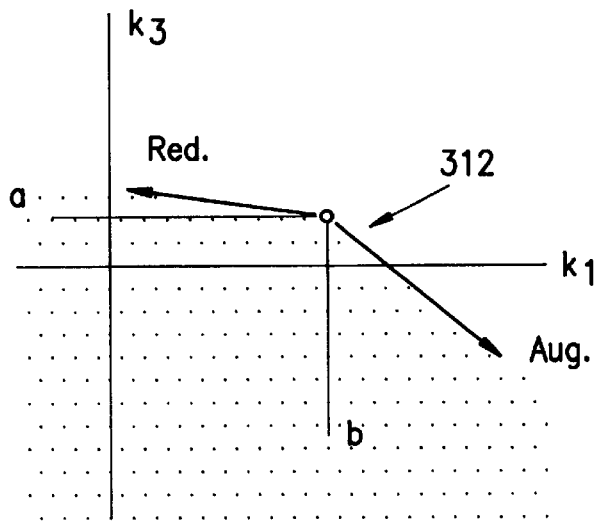
FIG. 20 is a diagrammatic illustration of two types of tuning.

These are two special cases of tuning. As shown by diagram 312 in FIG. 20, lines a and b are within the stiffness space accessible by the augmentation and reduction actuators of the example. Along the line a, the linear stiffness is tuned without any effect on the cubic stiffness. Likewise, along the line b, the cubic stiffness is tuned without any effect on the linear stiffness.

The following simple derivations show the voltage relationships necessary to tune along lines a and b. The sum of the tuning actuator forces is expressed as:

$$F_{sum}(x, V_a, V_r) = -(a_1 V_a^2 + r_1 V_r^2)x - (a_3 V_a^2 + r_3 V_r^2)x^3 \quad \text{(Eq. 7)}$$

If $$\frac{V_a}{V_r} = \sqrt{-\frac{r_1}{a_1}}, \quad \text{(Eq. 8)}$$

the linear term in x cancels. Provided two conditions are satisfied, the cubic term can be scaled independently of the linear term; $a_1$ and $r_1$ must have opposite signs and the two tuning vectors must not be collinear. Scaling of the cubic term proceeds by scaling $V_a$ and $V_r$ while maintaining the equality in Equation 8.

Likewise if $$\frac{V_a}{V_r} = \sqrt{-\frac{r_3}{a_3}} \quad \text{(Eq. 9)}$$

then the cubic stiffness contributions would cancel and the net linear term could be scaled.

Figure 21:
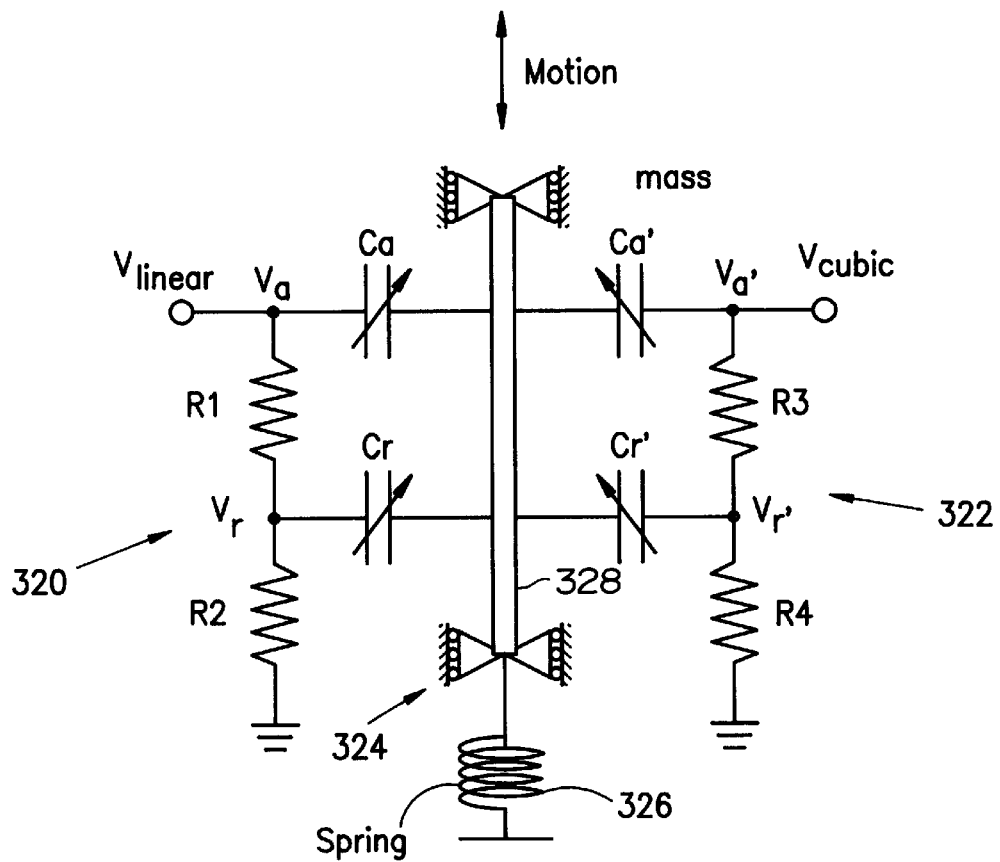
FIG. 21 illustrates a mechanical oscillator separately tunable for linear and cubic stiffness.

As illustrated in FIG. 21, two circuits 320 and 322 tune a centrally located mechanical oscillator 324. The circuit 320 on the left of the oscillator 324 tunes the linear stiffness and the circuit 322 on the right tunes the cubic stiffness. The mechanical oscillator, represented as a spring 326 attached to a bar 328, or mass, that can translate vertically, is electrically grounded.

Focusing on the circuit 320 to the left of the oscillator, two tuning actuators $C_a$ and $C_r$ represent an augmentation and reduction actuator, respectively. The linear stiffness of the spring mass can be tuned independently of the cubic stiffness when the voltage ratio expressed in Equation 9 is maintained. The voltage divider formed by resistors R1 and R2 maintains this ratio.

The tuning circuit 322 to the right of the oscillator is designed similarly. The primary difference is that R3 and R4 maintain the voltage ratio necessary to tune the cubic stiffness independently of the linear stiffness. The net linear and cubic stiffness can be expressed as:

$$k_1 = \left(a_1 - r_1 \frac{a_3}{r_3}\right) V_{linear}^2 + k, \text{ and} \qquad (Eq. 10)$$

$$k_3 = \left(a_3' - r_3' \frac{a_1'}{r_1'}\right) V_{linear}^2 + \eta. \qquad (Eq. 11)$$

These equations show the independent tuning capability: one voltage tunes the linear stiffness and one voltage tunes the cubic stiffness. Designs other than voltage dividers can be used to provide the voltage ratios. The important feature of the overall design is that the effective tuning vectors provided by the left and right circuits are othogonal and aligned with the stiffness axes. Solving the inverse problem of what voltages are needed to reach a particular point in the stiffness space is therefore simplified.

Tuning actuator pairs can be designed to either increase or decrease the linear or the cubic stiffness. Represented using the $(k_1, k_3)$ stiffness space illustrated in FIGS. 19 and 20, this capability is satisfied if one can construct actuators with tuning vectors that point to all four quadrants. Three design parameters can be used to design an actuator to point toward any of the four quadrants.

The first parameter is the alignment of the opposed fingers of the structure. By aligning the device to the augmentation configuration, the horizontal component of the tuning vector is positive. By aligning the device to the reduction configuration the horizontal component is negative. The remaining two parameters are illustrated in FIGS. 22 and 23, and determine the sign of the cubic stiffness contributed by either the augmentation or the reduction actuators.

Figure 22:
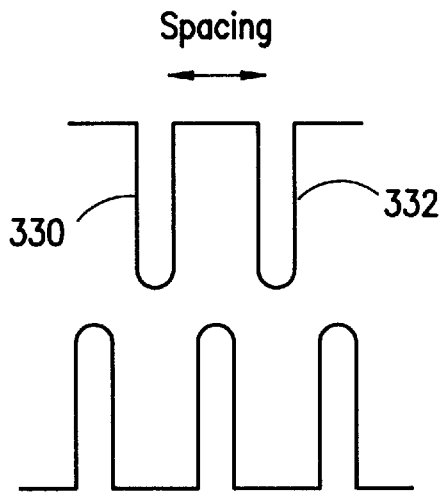
FIGS. 22 and 23 illustrate design parameters affecting the ratio of cubic and linear stiffnesses contributed by electrostatic actuators.

The spacing between adjacent fingers 330 and 332 indicated in FIG. 22 affects the sign of the cubic stiffness contributed by the reduction actuator. As shown by numerical results represented in FIG. 24, varying the spacing from 2 μm to 14 μm affects the shape of the curve between the minima and maxima. By fitting polynomials to the simulation data, the cubic stiffness contribution for each finger spacing is obtained, and the results are plotted in FIG. 25.

At a finger spacing of approximately 4.2 μm, there is a transition from positive to negative cubic stiffness. The presence of this transition indicates that the tuning vector passes from quadrant II to quadrant III in the stiffness space.

Figure 23:
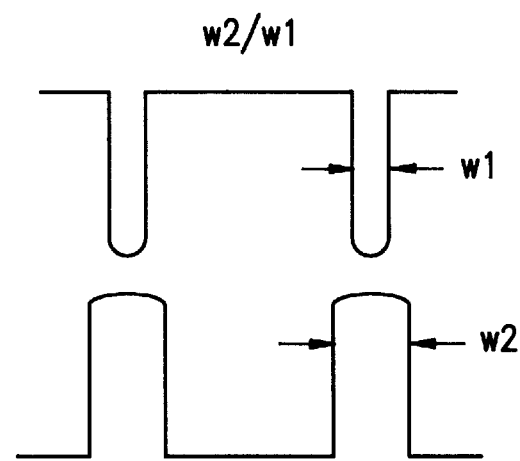
Figure 26:
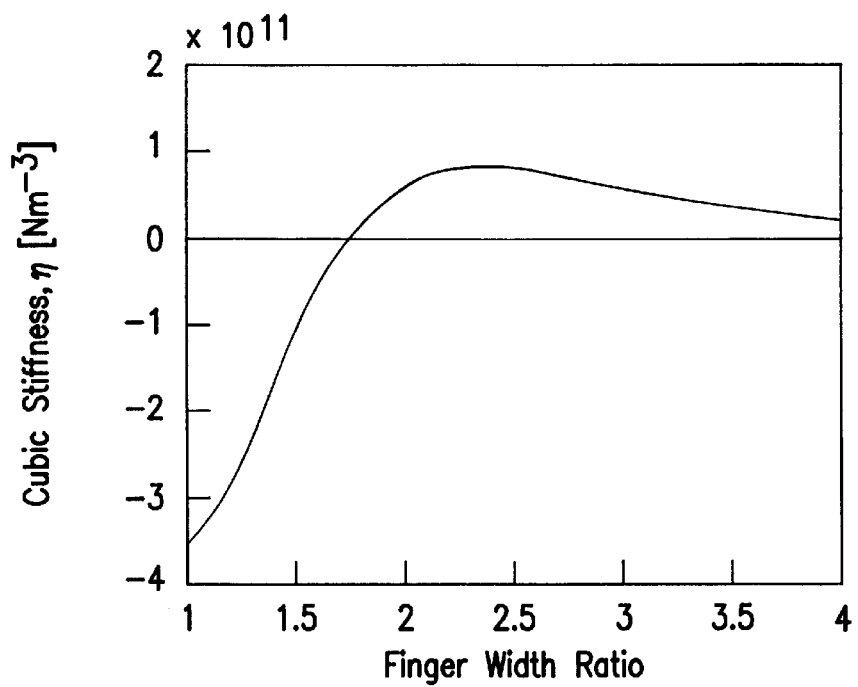
FIG. 26 is a graphical illustration of cubic stiffness where the relative widths between fingers is varied.

The finger width ratio, indicated in FIG. 23, affects the sign of the cubic stiffness contributed by the augmentation actuator. The force vs. deflection response for finger width ratios ranging from 1 to 4 to obtain cubic stiffness data is plotted in FIG. 26. Once again, there is a transition in the sign of the cubic stiffness.

Figure 24:
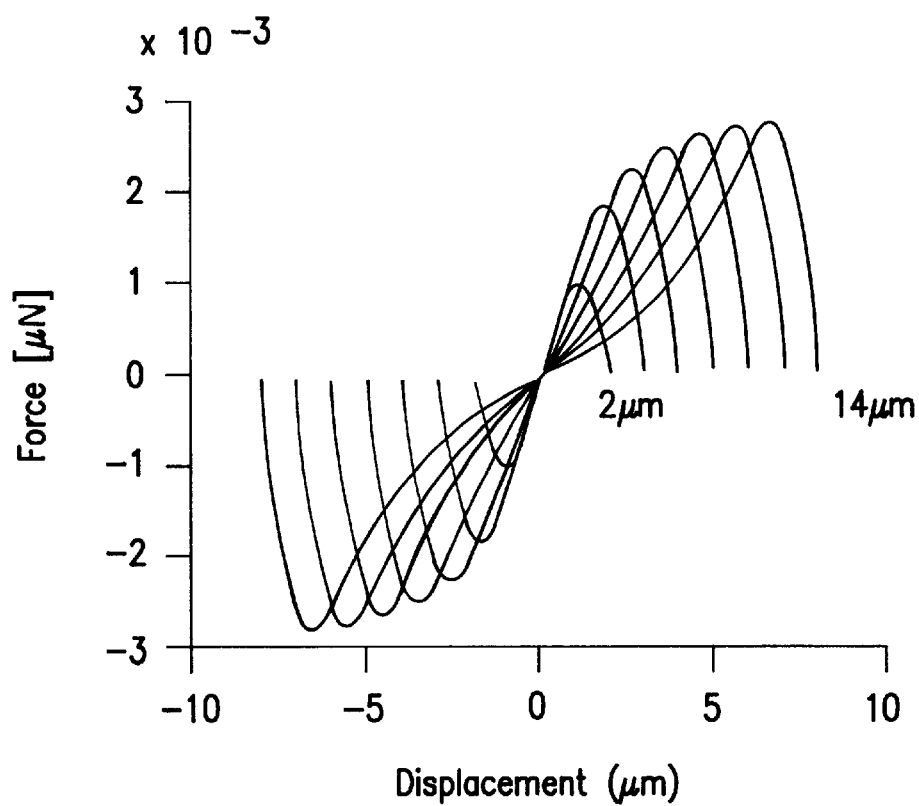
FIG. 24 illustrates the actuation force vs displacement for spacings between actuator fingers.
Figure 25:
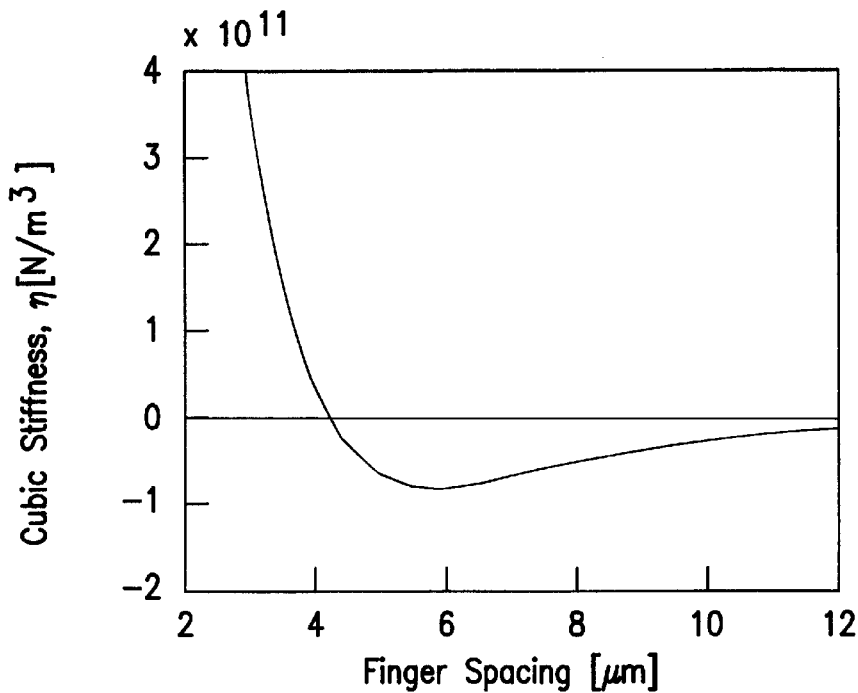
FIG. 25 illustrates cubic stiffness based on finger spacing.
Figure 27:
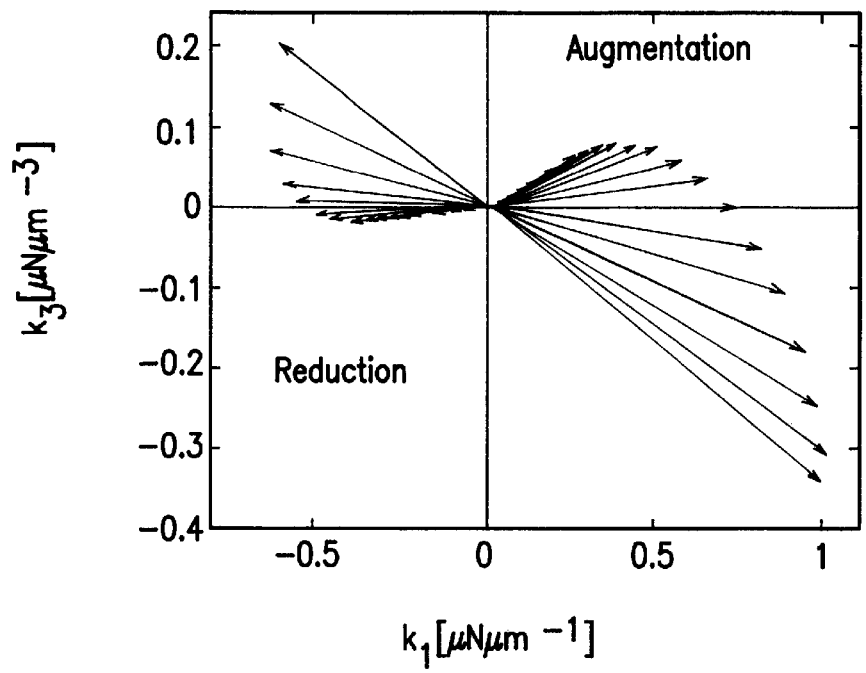
FIG. 27 is a graphical illustration of tuning vectors accessible through shifts in finger spacing and finger width ratios.

Referring back to the force vs. deflection response for finger spacing variations, FIG. 24, one can see a change in the slope and a change in higher order derivatives at x=0. These changes indicate a change in both the electrostatic linear and cubic stiffnesses. To show the change in linear stiffness with the change in cubic stiffness the numerical results are summarized in FIG. 27. Here, tuning vectors in all four quadrants are shown. Each tuning vector corresponds to a different actuator design. Those vectors that point to the left are reduction actuators and those that point to the right are augmentation actuators. The changes on the left are due to finger spacing variations, and the changes on the right are due to finger width ratio changes. In the illustration, finger spacings were varied from 2 to 12 μm. With one finger width fixed at 2 μm, the finger width ratio was varied from 1 to 4. Quadrants II and III are accessible via reduction actuators with variations in the finger spacing, while quadrants I and IV are accessible via augmentation actuators with variations in the finger width ratio.

Figure 28:
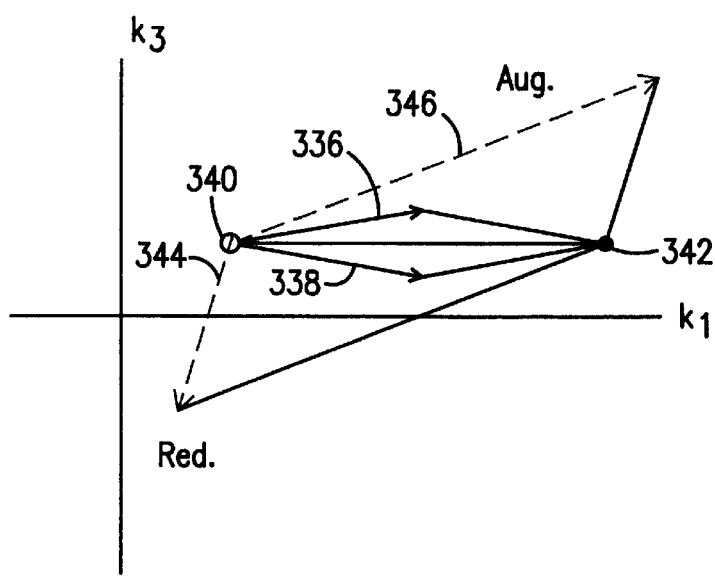
FIG. 28 is a diagrammatic illustration of efficient linear stiffness tuning.

To be able to tune a system in any direction in the stiffness space it is not necessary to have vectors in all four quadrants. Three tuning vectors that do not lie in the same 180° arc can span a stiffness space. Having more tuning vectors at ones disposal, however, can promote efficient use. For example, as shown in FIG. 28, two augmentation actuators represented by vectors 336 and 338 may be used to increase the linear stiffness only to tune the system from the open circle 340 to the closed circle 342. Compare that to the case where one augmentation actuator 344 and one reduction actuator 346 are used, as shown in dotted lines. Assuming that the tuning vector lengths are the same for a common voltage value, the pair of augmentation actuators would require less voltage to achieve the same increase in the linear stiffness.

As described above with respect to FIG. 6, a bistable system can be formed with a reduction actuator; however, the addition of a second actuator permits formation of a tristable actuator, as illustrated diagrammatically in FIGS. 29a, 29b and 29c.

Figure 12:
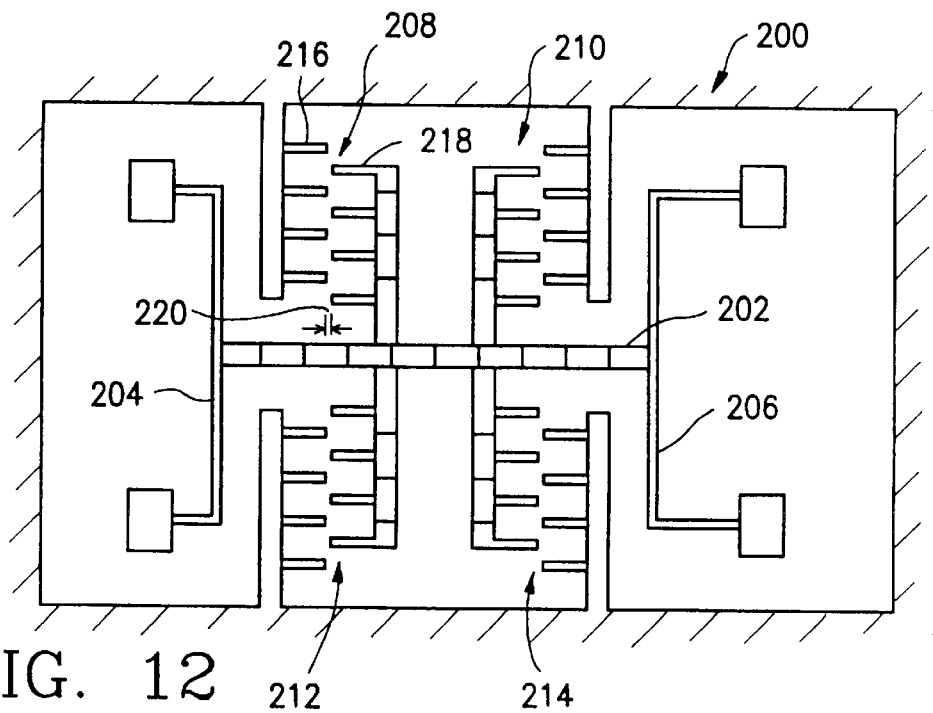
FIG. 12 is a diagrammatic top plan view of a tunable resonator utilizing perpendicular electrostatic tuning actuators.
Figure 13:
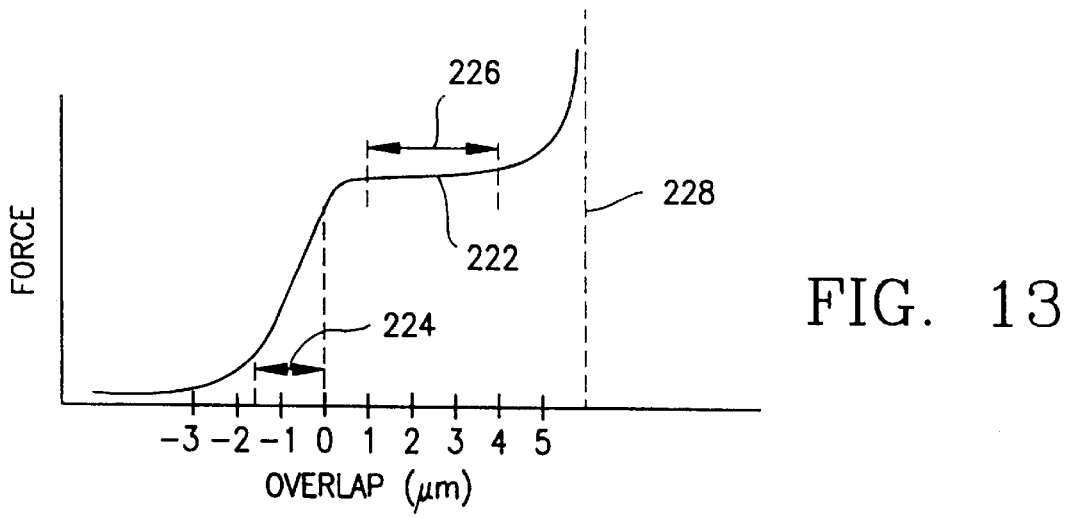
FIG. 13 illustrates a force vs. deflection curve for a comb actuator structure of the type illustrated in FIG. 12.

Essentially, the symmetric pair of actuators shown in FIG. 12 can be modeled as a single finger movable actuator 350, as shown in FIG. 29a. When centered between stationary fingers 352 and 354, with the same voltage on each finger, no force acts in the lateral motion direction and the fingers remain separated by an initial gap 356. As illustrated in FIG. 29a the fingers almost overlap, and when a voltage is applied, each fixed actuator attracts the movable finger. If sufficient voltage is applied to the actuators, the mechanical springs attached to the movable finger 350 (but not shown in FIG. 29a) will be unable to keep the finger centered and it will be drawn into one of the two actuator halves as shown in FIG. 29b or FIG. 29c. Likewise, a small disturbance can cause the finger to be drawn into one of the actuators.

If the gap 356 is large enough, it is possible to form a tristable system. When centered, for moderate actuator voltages, the movable finger is not drawn into either the left or the right fixed actuator; the actuators are too far away to exert sufficient force. However, if for some reason a disturbance causes the finger to move close to one of the two fixed actuators, it could be drawn in, for example to the right-hand actuator 354, and held as shown in FIG. 29b. In this arrangement there would be three equilibrium points: left, center, and right, to form a tristable actuator. This is illustrated by the three-well potential energy curve 358 in FIG. 29d, where ball 360 illustrates the energy well occupied by finger 350 when it has been pulled toward actuator 354.

It is also possible to form a tristable system with the fingers overlapped. When the finger is close to being centered, each actuator side pulls with the same force and cannot therefore draw the finger into one side or the other. Then if the finger is sufficiently displaced so that it no longer overlaps with one of the two sides, it will be drawn into the opposing side, as discussed above.

Figure 30:
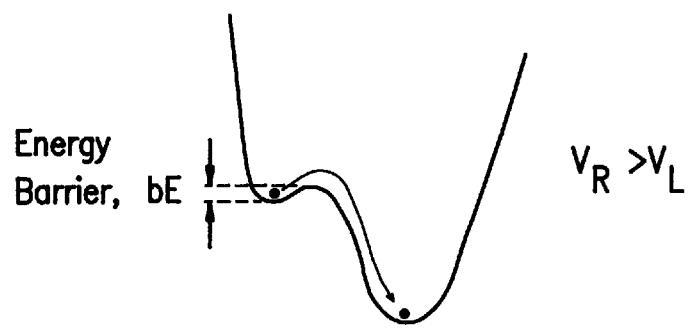
FIG. 30 is a diagrammatic illustration of the potential energy in a bistable or tristable actuator when unequal voltages are applied.

In the foregoing examples, the same voltage is applied to both of the actuators 352 and 354; i.e. the voltage $V_L$ on the left side is equal to the voltage $V_R$ on the right side. However, if different voltages are applied to the left and right sides, it is possible to adjust the energy barrier between the wells, as illustrated at 362 in FIG. 30 for the bistable structure such as that illustrated in FIG. 12. This capability is important in applications such as acceleration limit switches where, for example, the system is initially placed in the left well by charging the left-hand actuator before charging the right-hand actuator. If an acceleration occurs to the left and with sufficient magnitude, the energy barrier will be surmounted and the system will transition into the opposing well. Since the electrostatic actuators which form the bistable system work equally well as sensors, these same actuators can be used to sense which well the system is in and therefore when a certain acceleration threshold is overcome. Also, the acceleration threshold can be adjusted by adjusting the magnitudes of the voltages applied to the left and right actuators.

In general, a bistable system is formed with electrostatic actuators where the energy barrier between two wells can be adjusted by varying the voltage applied to the opposing actuator halves. With this general type of sensor, a variety of sources can be used to overcome the energy barrier and cause the system to switch from potential well to the other. These sources include quantities such as force, displacement, impact, and acceleration. Therefore this non-contact threshold switch can form the basis for a variety of threshold sensors.

The non-contact switch is advantageous because micromechanical devices frequently stick together when they touch. However, the sensing of the motion is much easier if a mechanical switch is activated. The present invention describes two ways to form a contact acceleration limit switch, one that uses a symmetric parallel plate actuator and one that use opposing comb drives.

The microelectromechanical structures (MEMS) described above have a variety of steady state behaviors which are produced by the application of drive signals to the described actuators. The MEMS devices described above generally include a movable spring mass portion supported by spring attachments, or flexible beams, for oscillatory motion along an axis with respect to a substrate, on which the structure is mounted. The spring beams provide a mechanical restoring force for the system and constrain the motion along the device axis. Oscillation occurs at the resonant frequency of the structure, and DC voltages applied to the tuning actuators described above modify the resonant frequency of the device to provide a tunable oscillator. Since the tuning actuators are capacitively coupled to the movable portion of the device, selected actuators can serve as motion sensors, producing an output signal which is a measure of the motion of the movable structure. In addition, the application of an AC excitation (or drive) signal to selected actuators introduces a driving force into the system to produce corresponding motion of the movable spring mass structure.

At low voltages, the outputs from sensors will stay around zero, indicating that the structure is resting at its initial equilibrium point with substantially no displacement; i.e., is monostable. The voltages applied to the actuators provide electrostatic attracting forces to the spring mass structure, and the higher the voltage, the bigger the attracting force. Increasing (decreasing) voltage at one side makes the structure move towards (away from) the corresponding actuator and the output signals produced by the motion of the spring mass show a corresponding continuous variation in the amplitude of spring motion.

As the DC bias voltages are increased, typically at about 28V or above, the system goes through a bifurcation process where the original equilibrium point at the center position becomes unstable and two new equilibrium points emerge at either side of the original, as described with the respect to FIG. 29d. The output of the motion sensor will be either a positive or a negative DC signal significantly bigger than zero. In terms of potential energy, the system can be described as having two wells similar to those in a Duffing system. Once the spring mass has moved to one of the two equilibrium points, decreasing the applied DC voltage on one side does not lead to a continuous change in the output amplitude produced by oscillation of the spring mass. The output stays at the original level (1) until the voltage on one side is reduced to a critical value. At this point, a change of sign is observed at the output (−1), which indicates that the spring mass structure has snapped over to the adjacent stable equilibrium point. If the voltage is then increased, the output stays at the current position. After the voltage reaches the same level as before, decreasing the voltage at the other actuator to a critical value makes the structure snap back to the original well. This confirms the existence of a double well potential.

Once in the bistable state, a series of interesting dynamic behaviors are displayed when the structure is excited at various frequencies and amplitudes on top of the DC bias. Under small amplitude AC driving, a small oscillation of the same frequency around one of the two wells is observed. By increasing the amplitude of the excitation, the structure shows period doubling and period tripling oscillations, with longer periods. Finally, the output displays oscillations over a continuous broad band frequency range, indicating chaotic behavior in the MEMS.

Figure 31:
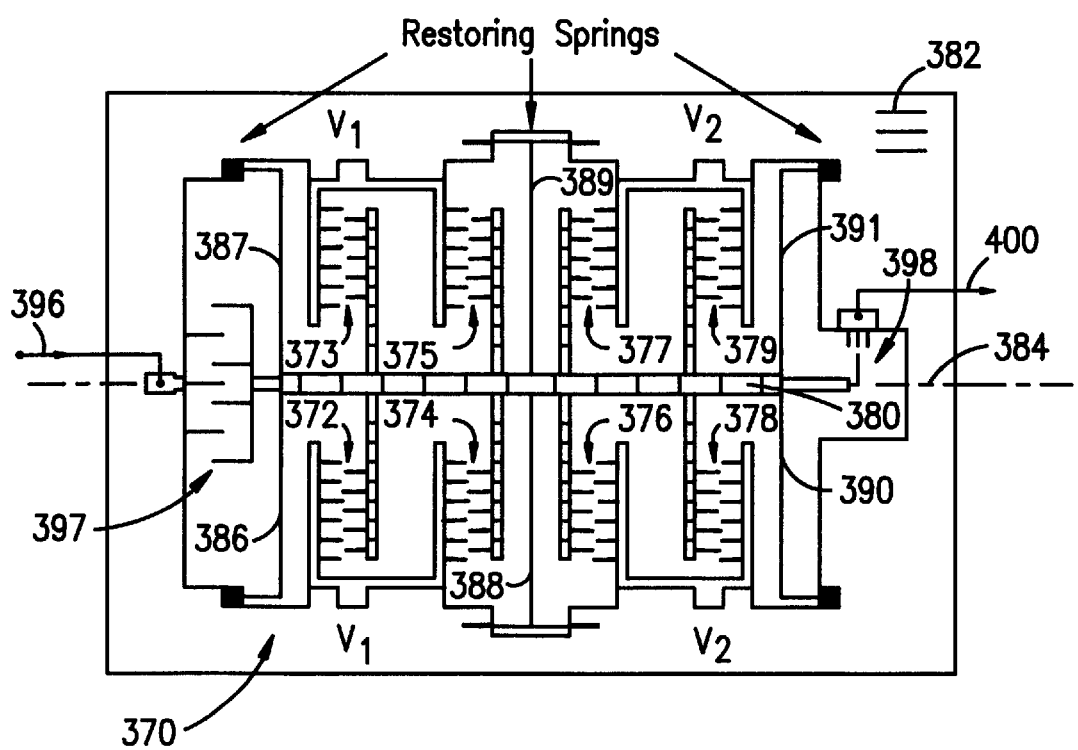
FIG. 31 is a diagrammatic illustration of a parallel-reduction MEMS tunable oscillator.

FIG. 31 is an example of a MEMS device 370 which uses parallel-reduction, non-overlapping comb drives 372–379 as the electrostatic tuning actuators for a spring mass 380. The spring mass is mounted for motion with respect to a substrate 382 along axis 384, by spring beams 386–391. In one embodiment, the MEMS structure measured less than 1.5 mm×0.075 mm, with the width of each finger being about 2 μm. Since the tuning actuators are able to reduce the resonant frequency of the oscillator, the device may be referred to as a parallel-reduction tunable oscillator.

The MEMS oscillator 370 can be modeled by a simple spring mass system:

$$m\ddot{x} = -k_1 x - k_3 x^3 - c\dot{x} + F(x, V). \tag{Eq. 12}$$

An exemplary MEMS oscillator based on the design of FIG. 31, had a mass, m, equal to $2.3 \cdot 10^{-9}$ kg; a mechanical linear stiffness, $k_1$, equal to 5.31 N/m; and a mechanical cubic stiffness, $k_3$, equal to $0.3 \cdot 10^{11}$ N/m$^3$. The electrical forcing function $F(x(t), V(t))$ is a function of time, t, displacement, x, and excitation electrode voltages, V.

The electrical force comes from the left and right comb drives. Each comb drive is composed of a number of parallel plate capacitors. The overall capacitance for a comb drive is proportional to the number of fingers and the overlap distance x between the fingers. The energy stored in a parallel plate capacitor is $W(x,V) = \frac{1}{2} C(x) V^2$, where C is the capacitance and V is the voltage difference between the two plates. Thus the force produced by the comb drive is an attracting force, $-\partial w/\partial x$, proportional to $V^2$.

Given that in the MEMS design, where there is no overlapping or gap between the actuator comb fingers, the electrical force is the sum from the left and the right:

$$F(x) = kV_1^2 u(x) - kV_2^2 u(-x), \qquad \text{(Eq. 13)}$$

where u(x) is the step function, k is a scaler and V1 and V2 are the voltages applied to the left and right tuning electrodes. However, this ideal model assumes that the electrical field in the comb drive is perfectly perpendicular to the fingers. In reality, electrical force has the form:

$$F(x) = V_1^2 f(x) - V_2^2 f(-x), \qquad \text{(Eq. 14)}$$

where f(x) is a function of the overlapping distance between comb fingers, or the displacement of the movable structure.

By selecting proper tuning electrode voltages, $V_1(t)$ for actuators 372–375 and $V_2(t)$ for actuators 376–379, and damping c, the system's potential energy indicates the formation of a double-well potential, and the behavior of the MEM oscillator 370 is similar to that of a Duffing oscillator.

Properly selected electrode voltages can introduce a desirable sinusoidal driving force and bring the system to chaotic steady state. This is done by using the anti-symmetrical components f(x) and f(-x) in the formula of F(x). Let $V_1 = V_0 - V_a \cos(\omega t)$ and $V_2 = V_0 + V_a \cos(\omega t)$, $$\begin{aligned} F(x) &= [V_0 - V_a\cos(\omega t)]^2 f(x) - [V_0 + V_a\cos(\omega t)]^2 f(-x) \quad \text{(Eq. 15)} \\ &= [V_0^2 + V_a^2/2 + V_a^2\cos(2\omega t)/2][f(x) - f(-x)] - \\ &\quad 2V_0 V_a\cos(\omega t)[f(x) + f(-x)] \\ &= (V_0^2 + V_a^2/2)[f(x) - f(-x)] - \\ &\quad 2V_0 V_a\cos(\omega t)[f(x) + f(-x)] + O(\cos(2\omega t)) \end{aligned}$$

The function $F_a(x) = (V_0^2 + V_a^2/2)[f(x) - f(-x)]$ contributes to the overall positive linear stiffness. The function $F_b(x) = -2V_0 V_a \cos(\omega t)[f(x) + f(-x)]$ introduces the sinusoidal excitation, whereas $F_c(x) = V_a^2 [f(x) - f(-x)]\cos(2\omega t)/2$ is the double frequency excitation, which has a smaller amplitude than that of $F_b(x)$. Since the system attenuation above frequency $2\omega$ is high, this term is omitted and treated as additive noise in the analysis.

Figure 32:
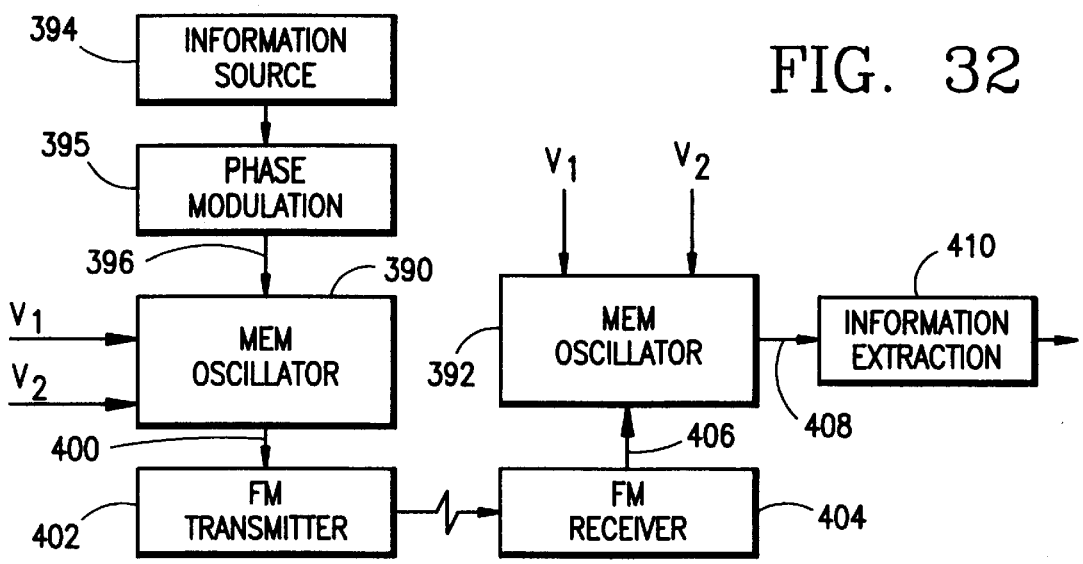
FIG. 32 is a block diagram of a secure communication system utilizing the tunable oscillator of the invention.

As illustrated in FIG. 32, the availability of a steady-state chaotic oscillation in the tunable MEM oscillator of the present invention provides a mechanism for producing a secure communication system by filtering an information signal through a chaotic MEMS system. An input signal can thus be encrypted in a first MEMS device, transmitted to a matched MEMS receiver, and decrypted. This is accomplished by fabricating a pair of MEMS oscillators 390 and 392 on the same substrate, or wafer, so that they will have very similar, although not necessarily identical, parameters. Even when separated, they will be sufficiently similar that secure communication between them can be achieved, because of their common origin, by using one oscillator as a filter to produce a noise-like, unintelligible signal, and using the other to recover the information signal through an inverse filter. The result is a symmetrical encryption system whose keys are the chaotic system parameters and the dynamic initial conditions of the system.

In the example of FIG. 32 an information signal from source 394 may be a binary signal, but preferably is a sinusoidal excitation signal. The sinusoidal signal is supplied through a phase modulator 395 and line 396 to electrostatic excitation actuators 397 of a MEM oscillator such as that illustrated at 370 in FIG. 31. Suitable DC voltages are also applied to actuators 372–379, as described above, so that the spring mass 380 is driven by the excitation signal to oscillate chaotically. This motion is detected by electrostatic sensors, such as fingers 398 in FIG. 31, to produce an encrypted output signal on line 400. This signal is delivered to a transmitter such as FM transmitter 402 for wireless transmission as a radio signal or for wireless transmission as by a cable to a suitable receiver 404.

The receiver 404 delivers the encrypted signal by way of line 406 to the second, matched MEMS oscillator 392, which is substantially the same as oscillator 370. The signal on line 406 is delivered to the excitation actuators 397 for oscillator 392 for decryption, and the resulting output signal from sensor 398 is delivered by line 408 to an information extraction circuit 410, to be described.

The MEMS secure communication system of the present invention is capable of transmitting either digital or analog signals. Although the transmission of digital signal is simpler, analog transmission can achieve a data rate one or two orders of magnitude higher.

Digital (or binary) communication can be achieved using synchronization of a MEMS transmitter and a substantially identical MEMS receiver. Such a digital system does not require the phase modulator of FIG. 32; information is transmitted by switching one parameter in the transmitter MEM between two levels, and the resulting signal is recovered by observing the synchronization status at the receiver. Thus, if $x_1$, denotes the transmitter MEM displacement, $x_2$ denotes its velocity, and $x_3$, $x_4$ denote the state variables for the oscillator which provide the sinusoidal input to the tuning electrodes, then the differential equation for the transmitter MEM (x) has the form:

$$\begin{aligned} \dot{x}_1 &= x_2 \quad &\text{(Eq. 16)} \\ \dot{x}_2 &= [F(x) - k_1 x_1 - k_3 x_1^3 - c x_2]/m \\ \dot{x}_3 &= -\omega x_4 \\ \dot{x}_4 &= \omega x_3 \\ F(x) &= V_1^2 f(x_1) - V_2^2 f(-x_1) \\ V_1 &= V_0 - V_a x_3 \\ V_2 &= V_0 + V_a x_3 \end{aligned}$$

Similarly, y represents the identical MEM at the receiver. Proper controls $p_1 u$ and $p_2 u$, where $u = x_1 - y_1$ (the displacement difference between the transmitter and receiver MEM devices), are applied to achieve synchronization:

$$\begin{aligned} \dot{y}_1 &= y_2 \quad &\text{(Eq. 17)} \\ \dot{y}_2 &= [F(y) - k_1 y_1 - k_3 y_1^3 - c y_2 + p_1 u]/m \\ \dot{y}_3 &= -\omega y_4 \\ \dot{y}_4 &= \omega y_3 + p_2 u \\ F(y) &= V_1^2 f(y_1) - V_2^2 f(-y_1) \\ V_1 &= V_0 - V_a y_3 \\ V_2 &= V_0 + V_a y_3 \\ u &= x_1 - y_1 \end{aligned}$$

The synchronization status can then be analyzed through the difference system between the transmitter and receiver MEM devices (z=x-y):

$$\begin{aligned} \dot{z}_1 &= z_2 \\ \dot{z}_2 &= [-(k_1 + p_1)z_1 - c z_2 - k_3(x_1^3 - y_1^3) + (F(x) - F(y))]/m \\ \dot{z}_3 &= -\omega z_4 \\ \dot{z}_4 &= -p_2 z_1 + \omega z_3 \end{aligned}$$

Figure 33A:
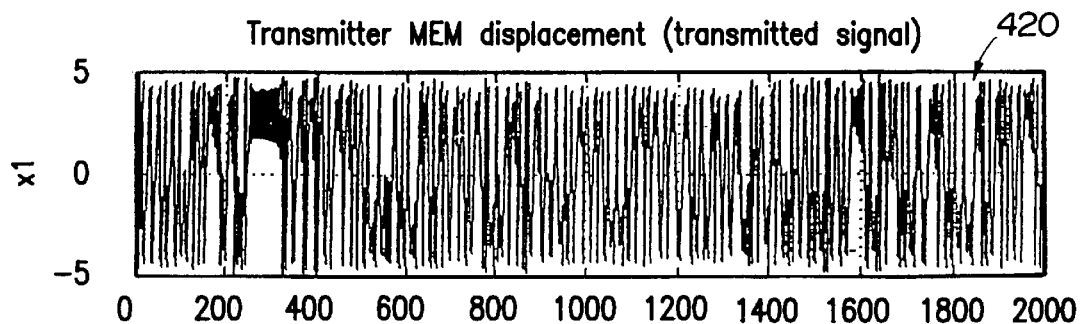
FIGS. 33A, 33B, and 33C illustrate transmitter MEM displacement, displacement difference between transmitter and receiver MEMS, and the information signal, respectively.
Figure 33B:
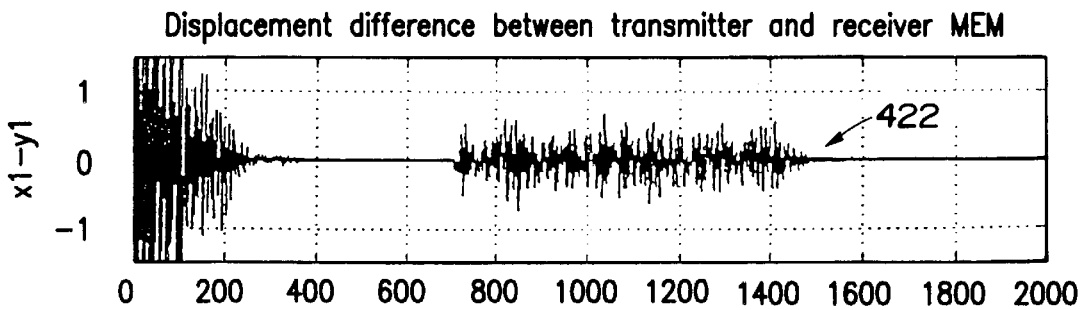
Figure 33C:
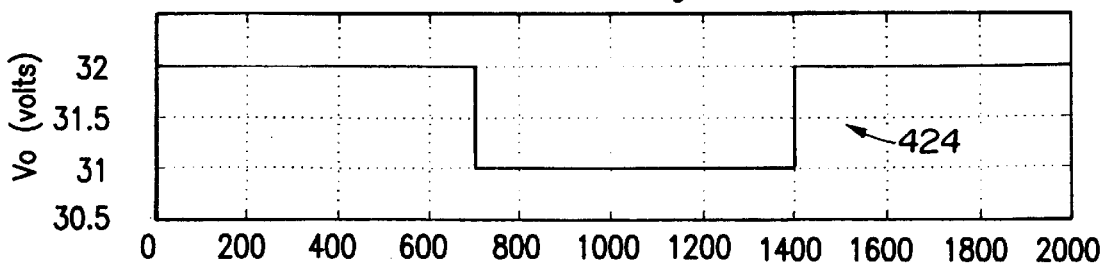

When proper control are applied, the difference system can be shown to be asymptotically stable at the origin, which guarantees the synchronization between identical MEM pairs. When the DC component of the tuning electrode voltages of the transmitter MEM is switched between two levels, the receiver MEM receives a sequence of on-lock and off-lock states, from which the binary message can be decoded, as demonstrated in FIGS. 33A–33C. In FIG. 33A, curve 420 represents measured transmitter displacement $x_1$, which is the transmittal signal. The displacement difference $z_1$ between the transmitter MEM and the receiver MEM, given by $(x_1-y_1)$, is illustrated at 422 in FIG. 33B, while FIG. 33C illustrates at 424 the control voltage, which is the DC component of the transmitter MEM tuning electrode voltage $V_0$. These figures represent a simulation of the MEM system, but demonstrate that the control of the binary system is simple and easily to implement. However, the data rate of such a system is limited by the convergence rate of the difference system, which is usually slow.

Analog transmission of information is obtained in the system of FIG. 32 by phase modulating the information signal U(t). The resulting chaotic MEM displacement signal is transmittal to the receiver, where it is decrypted. The differential equation for the transmitter MEM (x) shown at 390 in FIG. 32 is:

$$\dot{x}_1 = x_2 \quad \text{(Eq. 19)}$$

$$\dot{x}_2 = (F(x) - k_1 x_1 - k_3 x_1^3 - c x_2)/m$$

$$F(x) = V_1^2 f(x_1) - V_2^2 f(-x_1)$$

$$V_1 = V_0 - V_a \cos(\omega t + u(t))$$

$$V_2 = V_0 + V_a \cos(\omega t + u(t))$$

$$u(t) = .05 r(t)$$

The receiver has an identical MEM (y), shown at 392, and a control g(t) is applied to the MEM 392 cancel the non-linearity:

$$\dot{y}_1 = y_2$$

$$\dot{y}_2 = (F(y) - k_1 y_1 - k_3 y_1^3 - c y_2 + g(t))/m$$

$$F(y) = V^2{}_1 f(y_1) - V^2{}_2 f(y_1)$$

$$g(t) = (V^2{}_0 + V^2{}_2/2)(f(x_1) - f(-x_1)) - k_3(x^3{}_1 - y^3{}_1) - p(x_1 - y_1)$$

$$V_1 = 0$$

$$V_2 = 0$$

$$p = 1.0017$$

From the dynamics of the difference system between the transmitter and receiver MEM (z=x−y), which can be described as:

$$\dot{z}_1 = z_2 \quad \text{(Eq. 21)}$$

$$\dot{z}_2 = [-(k_1 - p)z_1 - cz_2 - 2V_0 V_a \cos(\omega t + u(t))(f(x_1) + f(-x_1)) + V_a^2 \cos(2\omega t + u(t))(f(x_1) - f(-x_1))/2]/m$$

$$= [-(k_1 - p)z_1 - cz_2 - 2V_0 V_a \cos(\omega t + u(t))(f(x_1) + f(-x_1)) + O(\cos(2\omega t + u(t)))]/m$$

$$\approx [-k(k_1 - p)z_1 - cz_2 - 2V_0 V_a \cos(\omega t + u(t))(f(x_1) + f(-x_1))]/m$$

it can be seen that the displacement difference $z_1$ is a linear filtered, amplitude modulated (by $f(x_1)+f(-x_1)$) version of the PM signal $\cos(\omega t + u(t))$.

Two issues are involved in the successful recovery of u(t): first the realization of control g(t) at the receiver; and second, the extraction of u(t) from the observation of $z_1(t)$. One way to realize the control is to use the excitation electrode if it can handle a big enough excitation force. Otherwise, a more complicated method is to use the tuning electrode of the receiver MEM. By adjusting the voltages at the two tuning electrodes, control g(t) can be realized as follow:

$$V_1 = \sqrt{g(t)/f(y_1)}, V_2 = 0 \quad \text{if } g(t) \geq 0 \quad \text{(Eq. 22)}$$

$$V_1 = 0, V_2 = \sqrt{-g(t)/f(-y_1)} \quad \text{if } g(t) < 0$$

Figure 34:
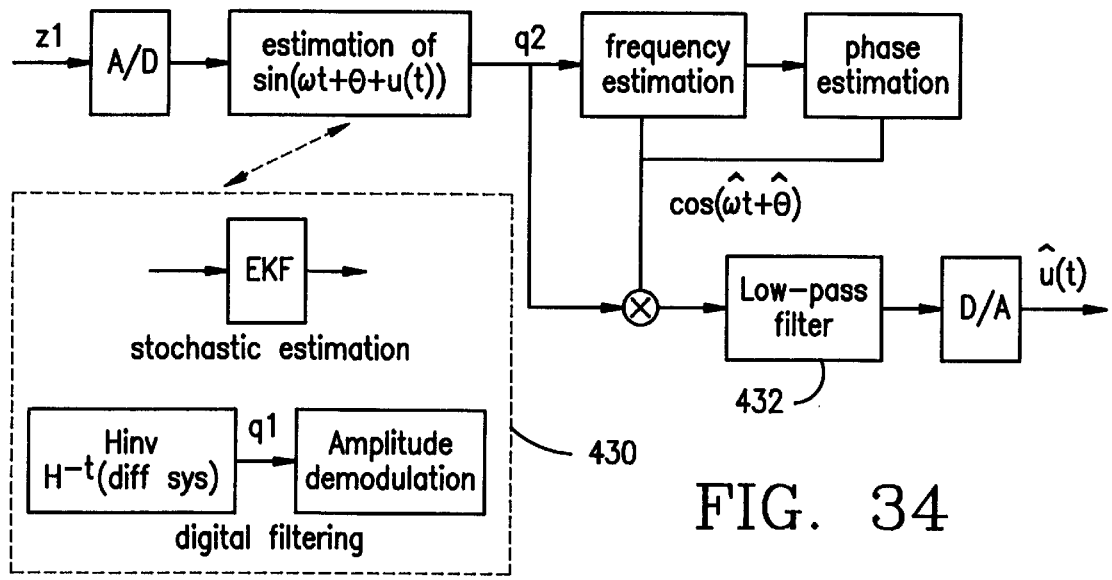
FIG. 34 is a flow chart showing the process of information extraction.

The extraction of the information signal u(t) is obtained by sampling the receiver output signals at a high rate. Information is extracted from the sampled data using DSP techniques. As shown in FIG. 34, a sequence of estimations are conducted before the information can be extracted. First, $q_2$, a sampled version of $\sin(\hat{\omega}t+\theta+u(t))$, where θ is some delay, is estimated, either through digital filtering or by stochastic estimation illustrated in block 430. Next, the carrier frequency ω and delay θ are estimated, denoted as $\hat{\omega}+\hat{\theta}$ and . Finally, the product of $q_2$ and $\cos(\hat{\omega}t+\hat{\theta})$ is filtered through a low-pass filter 432 which produces the recovered information signal u. Proper delay needs to be taken into account at each processing step.

As illustrated in block 430, two steps are involved in the digital filtering estimation of $q_2$: inverse filtering and amplitude demodulation. An inverse filter $H_{inv}$ of the difference system is constructed, such that $q_1$, a delayed version of the sampled signal $2V_0 V_a \cos(\omega t+u)(f(x_1)+f(-x_1))$ is obtained as the output of the inverse filter. $q_1$ is then amplitude demodulated (by a factor of $(1/(2V_0 V_a(f(x_1)+f(-x_1))))$, to generate the estimate of $q_2$. If a stochastic approach is preferred, extended kalman filtering can be implemented to extract $q_2$ from $z_1$.

To construct the inverse filter $H_{inv}$, the frequency response of the difference system $$\dot{z}_1 = z_2$$

$$\dot{z}_2 = (-(k_1-p)z_1 - k_2 z_2 + u_{input})/m \quad \text{(Eq. 23)}$$

is calculated and sampled. A least square method is applied such that the inverse filter compensates both the amplitude and the phase distortion from the difference system in the frequency range of interest (for example, 0~3ω). The frequency samples are dense enough and the filter length is long enough to guarantee the desired inversion performance. Because the difference system is a second order linear system, with big attenuation in the high frequency range, the inverse filter has to boost the high frequency component, thus also boosting the noise in those regions. Low-pass pre-filtering is recommended.

If an extended kalman filter (EKF) is used, then $q_2$ is the estimate of
$\cos(\omega t+u(t))$ and $2V_0 V_a(f(x_1)+f(-x_1))q_2$ is the input $u_{input}$ to the difference system:

$$\dot{z}_1 = z_2$$

$$\dot{z}_2 = (-(k_1-p)z_1 - cz_2 + u_{input})/m$$

$$u_{input} = 2V_0 V_a(f(-x_1)+f(-x_1))q_2 \quad \text{(Eq. 24)}$$

To recover $q_2$ through its filtered version $z_1$, $q_2$ is modeled as the output of a band-limited process, the sampling rate is chosen high enough (usually higher than the minimum required sampling rate the for digital filtering technique because of the amplitude modulation by $[f(x_1)+f(-x_1)]$ to $q_2$), the system is converted to discrete time, based on the sampling rate, and an extended kalman filtering technique is applied. Signal $q_2$ can then be successively recovered.

After inverse filtering and amplitude demodulation, $q_2$ an estimation of $\omega$ is carried out by obtaining $q_2$ a sampled version of the signal $\sin(\omega t+\theta+u(t))$. Since $u(t)$ is of small amplitude and zero mean, a phase-locked loop technique can be applied to estimate the carrier frequency.

Figure 35:
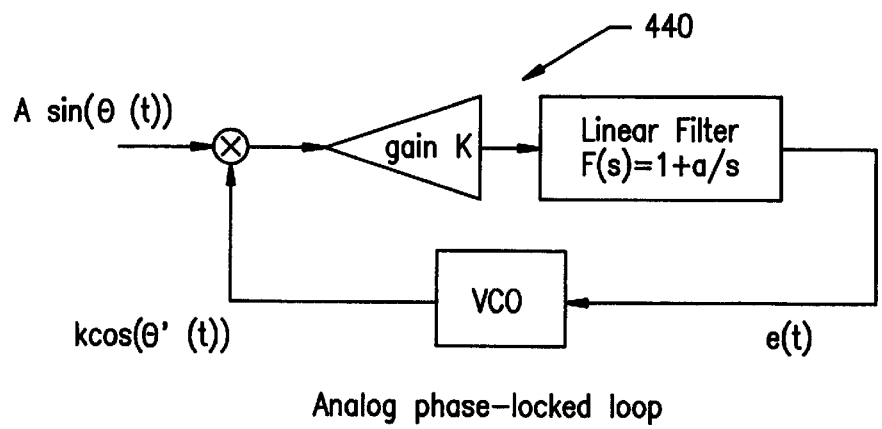
FIG. 35 is a diagrammatic illustration of an analog phase-locked loop circuit.
Figure 36:
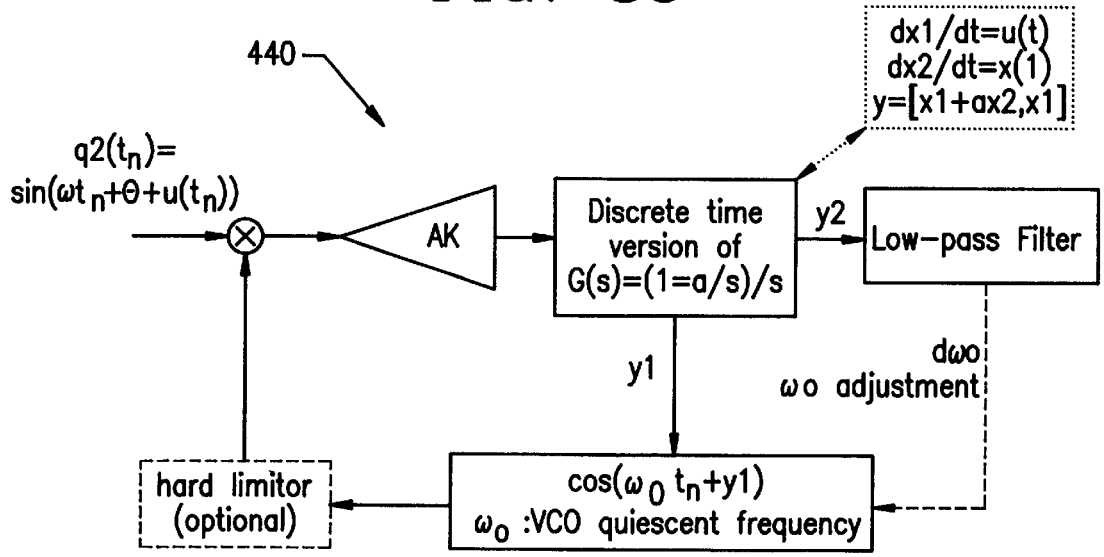
FIG. 36 is a diagrammatic illustration of the phase locked loop of FIG. 35 adapted to estimate ω from sampled data in the circuit of FIG. 34.

As shown in FIGS. 35 and 36, an equivalent discrete system 440 of a second order phase-locked loops (with gain, AK, linear filter $F(s)=1+a/s$) is constructed to handle the sampled data. As illustrated in FIG. 36, let

| | |
|---|---|
| $x_1, x_2$ | be the two state variables; |
| $T_s$ | be the sampled interval; |
| $y = [y_1, y_2]$ | be the system output; |
| $y_1$ | be the estimated phase difference between $q_2$ and the VCO quiescent phase $\omega_0 t$; |
| $y_2$ | be the carrier frequency estimation error; |
| $u_i$ | be the input to the linear filter G; |
| $\phi$ | be the state transition matrix; |
| $\omega_0$ | be the VCO quiescent frequency, or estimated carrier frequency. |

The discrete time system G has the form:

$$\phi = \exp([0\ 0;\ 1\ 0]T_s) \qquad \text{(Eq. 25)}$$

$$u_i(k) = q_2(k) * \cos(\omega_0 t(k) + y_1(k)), \text{ or}$$

$$q_2(k) * \text{sign}(\cos(\omega_0 t(k) + y_1(k)))$$

$$x(k+1) = \phi x(k) + [AK;\ 0]u_i(k)$$

$$y(k) = [1\ a;\ 1\ 0]x(k);\ \text{or}\ [1\ a;\ 1\ 0]x(k) + [0;\ AK]u_i(k)$$

The estimated frequency error $Y_2$ is low-pass filtered, scaled (multiplied by a factor between 0 and 2) and used as an adjustment to the VCO quiescent frequency.

Iterative estimation is performed on a given block of sampled data $q_2$. An adjustment to the carrier frequency estimate is made at the end of each iteration. Iteration is repeated until the desired accuracy of the estimate is achieved between successive adjustments.

A delay is introduced to $q_2$ from signal transmission and processing. The estimation of the phase delay $\theta$ is not as crucial as that of the carrier frequency because a wrong estimate ($\hat{\theta}$) will only induce a bigger amplitude attenuation by a factor of $\cos(\theta-\hat{\theta})$. If desired, a pair of phases $\theta_1$ and $\theta_2$ can be selected which are separated by $\pi/4$, and the bigger output of the low-pass filtered $q_2\sin(\omega+\theta_1$ or $\theta_2)$ can be chosen as the estimate of $u(t)$. Thus the worse case attenuation when $\theta-\hat{\theta}=\pm\pi/2$ can be avoided.

However, the fact that the DC component of $2q_2\sin(\hat{\omega}t)$ and $2q\cos(\omega t)$ correspond to $\cos(\theta)$ and $\sin(\theta)$ make the estimation of $\theta$ fairly simple.

Figure 37A:
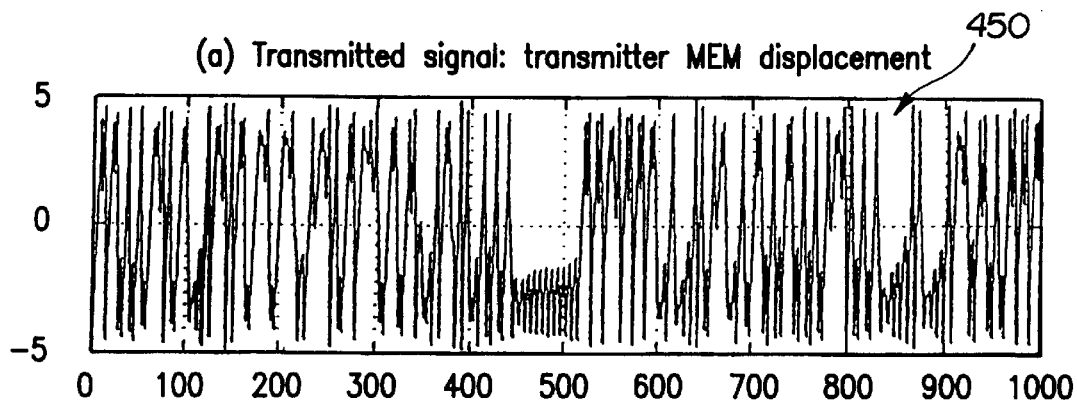
FIGS. 37A, 37B and 37C illustrate the encryption and description of a phase modulated signal.
Figure 37B:
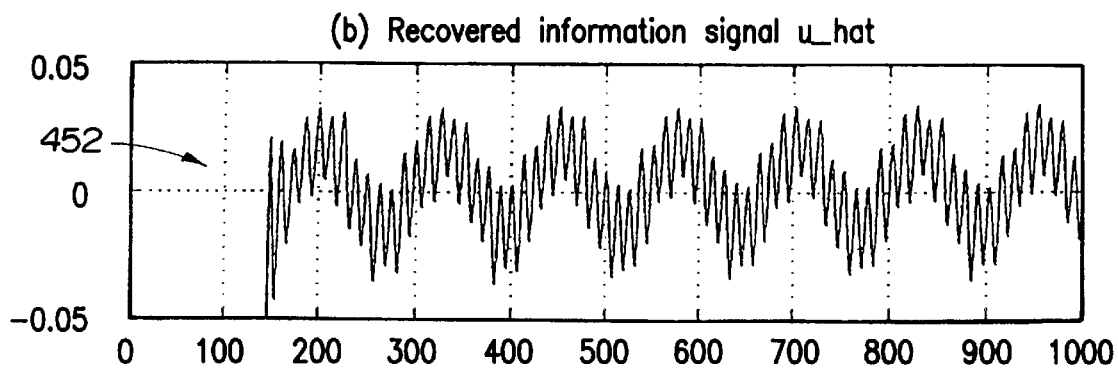
Figure 37C:
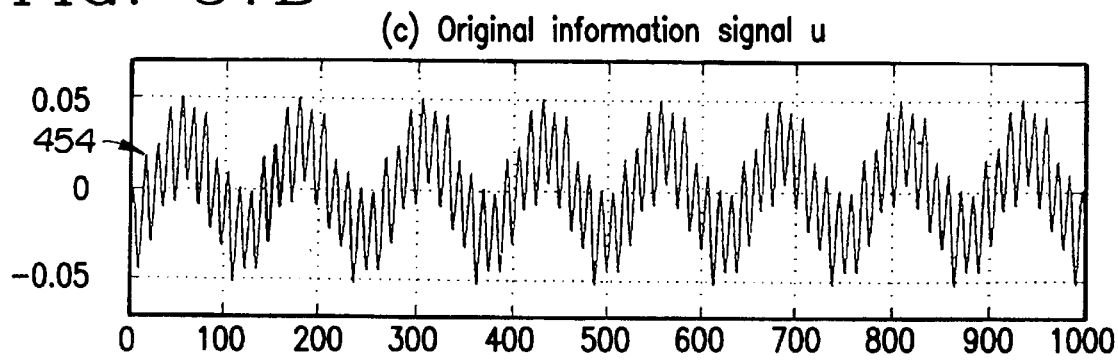

In a computer simulation, the operation of the foregoing system was demonstrated. FIG. 37A illustrates the transmitted MEM-encrypted signal 450, FIG. 37B illustrates the decrypted signal 452, and FIG. 37C illustrates the original signal 454.

Although the invention has been described in terms of preferred embodiments, it will be understood that the true spirit and scope of the invention is limited only by the following claims.

What is claimed is:

1. A multistable electromicromechanical resonator, comprising:

a substrate;

a micromechanical beam structure having micron-scale dimensions movable with respect to said substrate along an axis;

spring arms connected between said beam and said substrate, said spring arms and movable beam having a rest position and having a natural resonant frequency;

first and second electrostatic actuators, each actuator having a first set of finger electrodes mounted on said beam for motion with the beam, and each actuator having a second set of finger electrodes fixedly mounted on said substrate, said first and second sets of finger electrodes of each actuator being opposed and non-overlapping to provide a gap therebetween;

a bias voltage connected across each set of electrodes to shift said movable beam from said rest position to one of two stable positions to produce a bistable resonator; and a drive signal connected across selected electrodes to produce oscillation of said beam at said one stable position.

2. The resonator of claim 1, wherein said gap is parallel to said axis.

3. The resonator of claim 1, wherein said gap is perpendicular to said axis.

4. The resonator of claim 1, wherein the electrodes of said first set of finger electrodes for each actuator are aligned with corresponding electrodes of the second set of finger electrodes.

5. The resonator of claim 1, wherein the electrodes of said first set of finger electrodes for each actuator are offset from corresponding electrodes of the second set of finger electrodes.

6. The resonator of claim 1, wherein said first and second actuators are coplanar and symmetrical, whereby said actuators provide no net force on said beam in the rest position.

7. The resonator of claim 6, wherein said drive voltage is selected to cause said beam to oscillate at a frequency at or near said natural frequency.

8. The resonator of claim 6, wherein said drive voltage is selected to cause said beam to oscillate at a period which is double the period of said natural frequency.

9. The resonator of claim 6, wherein said drive signal is selected to cause said beam to oscillate chaotically over a broad band of frequencies.

10. The resonator of claim 9, further including a sensor responsive to motion of said beam to produce a chaotic output signal corresponding to chaotic oscillation of said beam, said output signal encrypting said drive signal in said chaotic output signal.

11. The resonator of claim 10, further including a second micromechanical resonator substantially identical said first-named resonator and adapted to receive as its drive signal the first-named resonator output signal for decryption of the first-named drive signal.

12. A microelectromechanical resonator system for secure communication, comprising:

a first and a second microelectromechanical spring mass, each mounted for motion with respect to a corresponding fixed support and having a rest position and a natural resonant frequency;

a plurality of electrostatic actuators connected between each fixed support and its corresponding spring mass;

bias voltages connected to said actuators to shift each spring mass to a bistable state;

a drive signal containing information to be communicated connected to drive said first spring mass to chaotic oscillation;

a sensor responsive to the oscillation of said first spring mass to produce a chaotic output signal incorporating said drive signal;

means for transmitting said chaotic output signal to drive said second spring mass to chaotic oscillation; and means for deriving from said chaotic oscillation of said second spring mass an output corresponding to said drive signal.

13. The system of claim 12, wherein said first and second microelectromechanical spring masses and said corresponding actuators for each are substantially identical.

14. The system of claim 13, wherein said drive signal contains binary information.

15. The system of claim 13, wherein said drive signal contains analog information.

* * * * *